(12) United States Patent
Cho et al.

(10) Patent No.: US 11,925,073 B2
(45) Date of Patent: Mar. 5, 2024

(54) STRETCHABLE POLYMER AND DIELECTRIC LAYERS FOR ELECTRONIC DISPLAYS

(71) Applicant: Applied Materials, Inc., Santa Clara, CA (US)

(72) Inventors: Kyuil Cho, Santa Clara, CA (US); Byung Sung Kwak, Portland, OR (US); Robert Jan Visser, Menlo Park, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 17/494,600

(22) Filed: Oct. 5, 2021

(65) Prior Publication Data
US 2022/0028942 A1 Jan. 27, 2022

Related U.S. Application Data

(63) Continuation of application No. 16/698,805, filed on Nov. 27, 2019, now Pat. No. 11,211,439.

(51) Int. Cl.
*H01L 27/32* (2006.01)
*H10K 59/122* (2023.01)
*H10K 59/35* (2023.01)
*H10K 102/00* (2023.01)

(52) U.S. Cl.
CPC ......... *H10K 59/122* (2023.02); *H10K 59/352* (2023.02); *H10K 59/353* (2023.02); *H10K 2102/311* (2023.02)

(58) Field of Classification Search
CPC ............. H01L 27/3246; H01L 27/3283; H01L 27/3295; H01L 2251/5338; H01L 51/5253; H01L 51/448; H01L 51/5256; H10K 59/122; H10K 59/352; H10K 59/353; H10K 2102/311; H10K 50/8445
See application file for complete search history.

(56) References Cited

U.S. PATENT DOCUMENTS

| | | | |
|---|---|---|---|
| 6,087,196 | A | 7/2000 | Strum et al. |
| 6,879,319 | B2 | 4/2005 | Cok |
| 8,541,778 | B2 | 9/2013 | Seki et al. |
| 9,082,999 | B2 | 7/2015 | Bernard et al. |
| 9,482,873 | B2 | 11/2016 | Lin |
| 9,735,386 | B2 | 8/2017 | Xue |
| 10,109,809 | B2 | 10/2018 | Hong et al. |

(Continued)

OTHER PUBLICATIONS

International Search Report and Written Opinion in International Appln. PCT/US2020/061668, dated Mar. 17, 2021, 11 pages.

*Primary Examiner* — Changhyun Yi
(74) *Attorney, Agent, or Firm* — Fish & Richardson P.C.

(57) ABSTRACT

A display device includes a display layer having a plurality of light-emitting diodes and an encapsulation layer covering a light-emitting side of the display layer. The encapsulation layer includes a plurality of first polymer projections on display layer, the plurality of first polymer projections having spaces therebetween, and a first dielectric layer conformally covering the plurality of first polymer projections and any exposed underlying surface in the spaces between the first polymer projections, the dielectric layer forming side walls along sides of the first polymer projections and defining wells in spaces between the side walls.

18 Claims, 13 Drawing Sheets

(56) References Cited

U.S. PATENT DOCUMENTS

| | | |
|---|---|---|
| 10,132,478 B2 | 11/2018 | Vasylyev |
| 10,217,964 B2 | 2/2019 | Heo |
| 10,310,260 B2 | 6/2019 | Yanai et al. |
| 10,340,475 B2 | 7/2019 | Wu |
| 10,489,544 B2 | 11/2019 | Lin et al. |
| 10,910,598 B2 | 2/2021 | Song et al. |
| 2005/0012448 A1 | 1/2005 | Ke et al. |
| 2007/0196682 A1* | 8/2007 | Visser ............... H01L 23/562 257/E23.194 |
| 2010/0045575 A1 | 2/2010 | Kim |
| 2010/0110551 A1 | 5/2010 | Lamansky et al. |
| 2010/0155709 A1* | 6/2010 | Hack ............... H01L 51/5256 257/40 |
| 2013/0001620 A1 | 1/2013 | Sugisawa et al. |
| 2015/0060826 A1 | 3/2015 | Matsumoto et al. |
| 2015/0144919 A1 | 5/2015 | Matsumoto et al. |
| 2015/0214504 A1 | 7/2015 | Sonoda et al. |
| 2015/0319813 A1* | 11/2015 | Khachatryan ........ H10K 50/844 313/504 |
| 2015/0357589 A1 | 12/2015 | Zhu et al. |
| 2016/0056414 A1 | 2/2016 | Mohan et al. |
| 2016/0268554 A1 | 9/2016 | Wu et al. |
| 2016/0272884 A1 | 9/2016 | Kim et al. |
| 2017/0139278 A1 | 5/2017 | Zhong |
| 2017/0271619 A1 | 9/2017 | Sumita |
| 2018/0190625 A1 | 7/2018 | Steckel et al. |
| 2019/0067629 A1 | 2/2019 | Wu |
| 2019/0165061 A1* | 5/2019 | Jung .................... H10K 50/858 |
| 2019/0259634 A1 | 8/2019 | Wang et al. |
| 2019/0379006 A1 | 12/2019 | Lim et al. |
| 2020/0161579 A1* | 5/2020 | Kim ..................... H10K 59/38 |
| 2020/0258946 A1* | 8/2020 | Kim ..................... H10K 59/38 |
| 2021/0159457 A1 | 5/2021 | Cho et al. |
| 2021/0159458 A1 | 5/2021 | Cho et al. |
| 2021/0159459 A1 | 5/2021 | Cho et al. |
| 2022/0246888 A1 | 8/2022 | Cho et al. |
| 2022/0293888 A1 | 9/2022 | Cho et al. |

\* cited by examiner

STRETCHABLE POLYMER AND DIELECTRIC LAYERS FOR ELECTRONIC DISPLAYS

CROSS-REFERENCE TO RELATED APPLICATIONS

This application is a continuation application of and claims priority to U.S. application Ser. No. 16/698,805, filed on Nov. 27, 2019, the disclosure of which is incorporated by reference.

TECHNICAL FIELD

This disclosure relates to electronic displays, and more particularly to encapsulation layers for protecting components, particularly organic light emitting diodes, in an electronic display.

BACKGROUND

An electronic display typically includes multiple layers deposited on a substrate. For example, an organic light-emitting diode (OLED) display includes, on a substrate, a back-plane (e.g., one that includes electrical control elements such as thin film transistors), a front-plane, an encapsulation, and other functional elements (e.g., touch-sensitive components, a hard coat, a polarizer) in various configurations (in-cell, on-cell). The front-plane includes an anode layer, a conductive layer, an emissive layer, and a cathode layer. A typical OLED display can also include an encapsulation to protect the layers of the display, e.g., from ambient oxidants (e.g., moisture, oxygen), dust, and other atmospheric conditions. Typically, the encapsulation is provided by a glass lid or by one or more barrier layers. For a flexible encapsulation, the OLED display can be coated by a barrier bi-layer that includes a stack of two generally planar and continuous layers: an organic layer and an inorganic layer.

SUMMARY

In one aspect, a display device includes a display layer having a plurality of organic light-emitting diodes (OLEDs) and an encapsulation layer covering a light-emitting side of the display layer. The encapsulation layer includes a plurality of first polymer projections on display layer, the plurality of first polymer projections having spaces therebetween, and a first dielectric layer conformally covering the plurality of first polymer projections and any exposed underlying surface in the spaces between the first polymer projections, the dielectric layer forming side walls along sides of the first polymer projections and defining wells in spaces between the side walls.

In another aspect, the spaces between the first polymer projections expose an underlying surface.

In another aspect, the plurality of first polymer projections are a plurality of curved convex polymer projections on the underlying dielectric layer.

In another aspect, the plurality of first polymer projections have sides that are substantially perpendicular to the top surface of the display layer and an upper surface that is substantially parallel to the top surface.

In another aspect, a plurality of second polymer projections are disposed on the first dielectric layer, the plurality of second polymer projections having spaces therebetween that expose the first dielectric layer, and a second dielectric layer conformally covers the plurality of second polymer projections and the first dielectric layer in the spaces between the plurality of second polymer projections, the second dielectric layer forming side walls along sides of the plurality of second polymer projections and defining wells in spaces between the side walls of the second dielectric layer.

In another aspect, the encapsulation layer includes a plurality of bilayers, each bilayer including a plurality of polymer projections and a dielectric layer.

In another aspect, the side walls are aligned with the gaps between the OLEDS.

In another aspect, the side walls are positioned at a uniform lateral positions relative the OLEDs, to pixels comprising a plurality of OLEDs, or to groups of pixels.

Implementations may include one or more of the following features.

The display layer may have a capping layer covering the plurality of organic light-emitting diodes. The display layer may have a non-planar top surface. The underlying surface may be a top surface of the display layer.

The encapsulation layer may include an underlying dielectric layer contacting and conformally covering the display layer, and the underlying surface may be a top surface of the underlying dielectric layer. The underlying dielectric layer may be the same material as the first dielectric layer.

The first dielectric layer may be an inorganic oxide or mixture of inorganic oxides. The first polymer projections may be a photoresist.

The plurality of first polymer projections may be provided by a plurality of discrete projections. At least a portion of the sides of at least one first polymer projection may be at an oblique angle relative to the underlying surface. The first polymer projections may be curved convex projections, e.g., hemispherical projections. The sides of at least one first polymer projection may be at right angles relative to the underlying surface. The plurality of first polymer projections may include a plurality of annular projections having one or more side walls, and spaces between the polymer projections may include an aperture surrounded by the one or more side walls of the annular projections. The plurality of annular projections may be hexagonal.

The plurality of first polymer projections may be provided by an interconnected structure having a plurality of apertures, and wherein the spaces between the first polymer projections may be provided by the plurality of apertures. The interconnected structure may be a honeycomb-shaped structure.

A polymer filler may partially or completely fill the wells. The polymer filler may cover the first dielectric layer.

The first polymer projections and the second polymer projections may be the same polymer material, and the first dielectric material and second dielectric material may be the same dielectric material.

The second dielectric layer may contact the first dielectric layer. The second dielectric layer may contact the first dielectric layer in regions between the sides of adjacent polymer projections. The second dielectric layer may be separated from the first dielectric layer by a polymer in regions over the first plurality of polymer projections.

The second polymer projections may be aligned above the first polymer projections. The second polymer projections may be laterally offset from the first polymer projections. The first polymer projections may be hexagonal close packed and the second polymer projections may be hexagonal close packed and offset relative to the first plurality of polymer projections.

A plurality of third polymer projections may be disposed on the second dielectric layer. The third polymer projections may have spaces therebetween that expose the second dielectric layer. A third dielectric layer may conformally cover the third polymer projections and the second dielectric layer in the spaces between the third polymer projections. The third dielectric layer may form side walls along sides of the third polymer projections and defining wells in spaces between the side walls of the third dielectric layer. A polymer filler may completely fill the wells in the spaces between the side walls of the second dielectric layer. The polymer filler may cover the third dielectric layer.

A polymer filler layer may cover the dielectric layer of an outermost of the plurality of bilayers.

At least two of the polymer projections may span a plurality of OLEDs. The plurality of organic light-emitting diodes (OLEDs) may include OLED tuples of different colors, and wherein at least two of the polymer projections may span OLED tuples. The plurality of organic light-emitting diodes may include a plurality of pixels, each pixel including an OLEDs tuple of different colors, and the side walls may be aligned with gaps between the pixels. The pixels may be arranged in a stripe pixel geometry or a PenTile pixel geometry. At least two of the polymer projections may span a plurality of pixels.

The subject matter described in this specification can be implemented to provide, but is not limited to, one or more of the following advantages. Electronic displays, e.g., OLED displays, can be protected by an encapsulation that features increased durability compared to conventional encapsulations. The electronic device can be bent, flexed, or stretched with reduced risk of damage or failure. The encapsulation can be fabricated at a commercially viable cost.

The details of one or more embodiments are set forth in the accompanying drawings and the description below. Other features, aspects, and advantages will become apparent from the description, the drawings, and the claims.

DESCRIPTION OF DRAWINGS

Like reference numbers and designations in the various drawings indicate like elements.

DETAILED DESCRIPTION

Figure 1A:
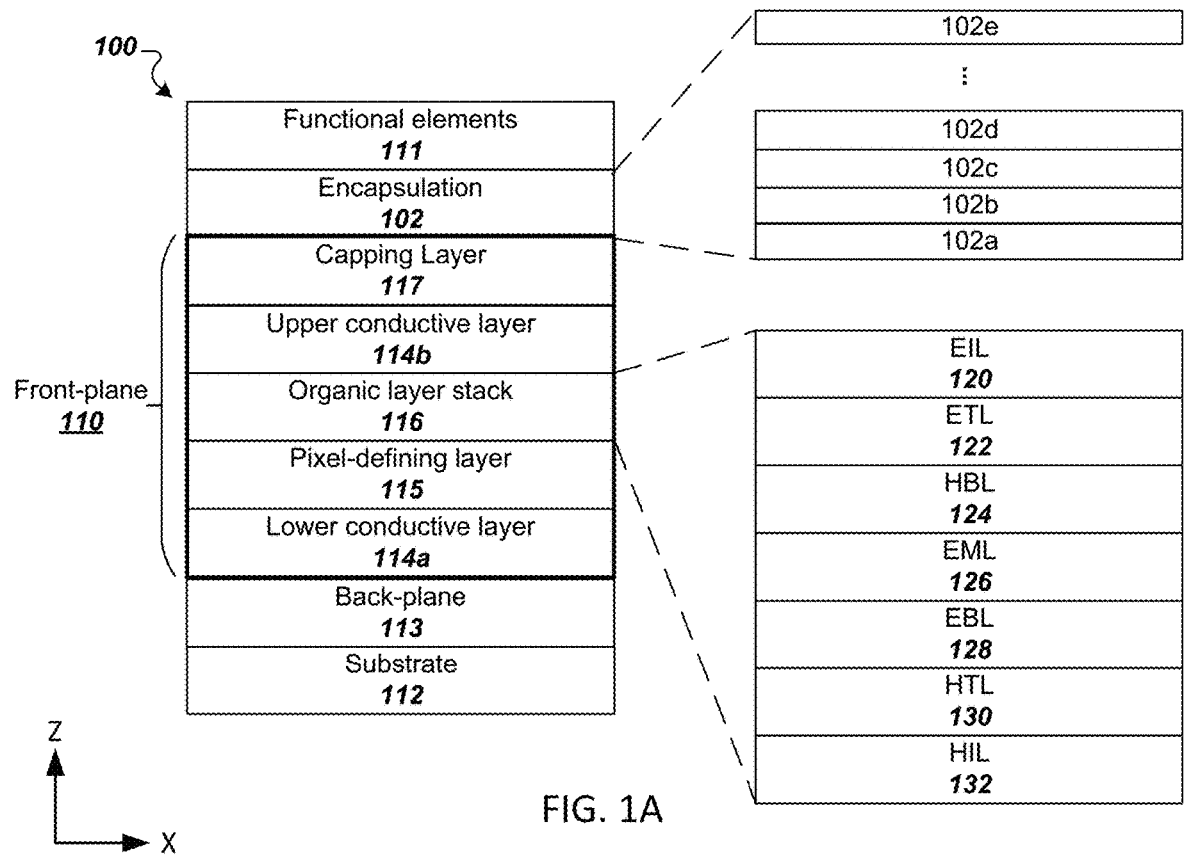
FIG. 1A is a schematic diagram of the layers in an OLED device.

A stretchable, flexible electronic display is desirable for some display applications, e.g., television displays or mobile phone displays. However, conventional stretchable displays, and techniques for making them, are prone to a number of problems. Many conventional stretchable displays include inorganic materials that are brittle and vulnerable to cracking when the display is bent or stretched. For example, inorganic materials can be found in the encapsulation layer and in other subcomponents of the electronic display (e.g., a back-plane of the display that includes electronic circuitry, e.g., thin-film transistors (TFTs), to drive the light emitting elements).

Bending or stretching a conventional display can result in a distribution of stress that varies between the layers along the depth of the display. For example, bending a display subjects one face of the display to compressive stress and the opposite face to tensile stress. Thus, a region between the two faces of the display may be stress-neutral as the stress distribution transitions from compressive to tensile stress through the depth of the display. A conventional approach to stretchable displays is to attempt to position layers of the display in a "stress-neutral" plane. However, the finite thickness of certain display elements, e.g., the back-plane, frontplane, and thin-film encapsulation (TFE), can result in critical layers being positioned outside the stress-neutral plane. As a result, these layers are subjected to failures.

The subject matter described herein pertains to a thin-film encapsulation that is more robust during bending, flexing, and stretching. Unlike conventional stretchable displays, the displays described herein can include a back-plane and front-plane that are in the stress-neutral plane, while the TFE can be positioned outside of the stress-neutral plane, thus making the display more robust.

Cracks in the encapsulation layer permit moisture and other oxidants to reach the light emitting layer, reducing display lifetime or introducing visual defects. Moreover, the cracks in the encapsulation layer can themselves cause visual defects, e.g., black spots or aberrant light paths on the display, decreasing picture quality.

Encapsulation techniques discussed herein can provide increased flexibility and stretchability for electronic displays, as well as increased durability for flexible and/or stretchable electronic displays. One such technique includes layers of polymer dots interspersed with conformal dielectric layers. Another technique includes one or more polymer lattices interspersed with conformal dielectric layers. Such structures should be highly flexible and stretchable without incurring significant damage to the encapsulation. Without being limited to any particular theory, when the device is stretched horizontally, vertically extending portions of the conformal barrier layer can splay outward while the polymer material is compressed. This permits the otherwise brittle barrier layer to bend or stretch with a reduced risk of cracking or incurring other defects. For example, the layer of polymer dots or lattices can conform to the shape that the display is bent or stretched into, while the total length (in this case including vertical excursions) of the conformal dielectric layers remain roughly constant.

The encapsulation layers can be formed by sequential deposition of layers of materials, for example, using an inkjet printer for the polymer material. The polymer material of the encapsulation layer can also be deposited using a nano- or micro-imprint lithography (NIL or MIL) process, e.g., a thermal NIL/MIL or UV NIL/MIL process. The conformal barrier layer can be deposited by a vapor phase deposition, e.g., physical vapor deposition, chemical vapor deposition, or atomic layer deposition.

Figure 1B:
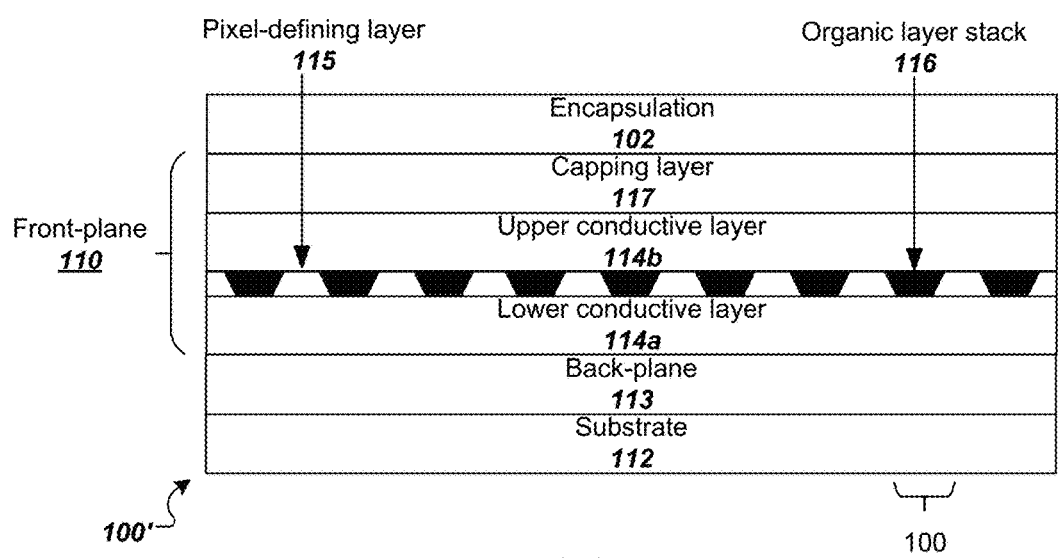
FIG. 1B is a schematic diagram of an OLED display with multiple OLEDs and that includes a subpixel defining layer with apertures that extend through the layer and OLEDs in the apertures.

FIGS. 1A and 1B illustrate schematic cross-sectional views of an OLED device 100 and an OLED display 100' that includes multiple OLED devices 100. The OLED device 100 and OLED display 100' include an encapsulation 102 disposed over a front-plane 110. A Cartesian coordinate system is provided for ease of reference. The OLED device 100 and OLED display 100' include a substrate 112 on which is formed a back-plane 113 that provides electronic circuitry, e.g., an array of thin-film transistors (TFTs), to drive the light-emitting elements of the front-plane 110.

The substrate 112 provides support to the other components of the front-plane 110. That is, the substrate 112 can be a base layer on top of which the other components of the OLED device 100 are sequentially deposited during manufacturing. For example, the substrate 112 can be plastic or glass.

In some implementations, a sacrificial substrate is used during manufacturing to provide support for some portion of the front-plane, e.g., the front-plane 110 and encapsulation 102, but the substrate is removed for the final device. For example, the back-plane 113, front-plane 110, and encapsulation 102 could be removed from a plastic or glass substrate, and optionally placed on a substrate, such as a flexible polymer layer, that is sufficiently flexible for the end use device, e.g., in a flexible display. In short, the substrate 112 that is used for the fabrication of the OLED devices can be less flexible than the substrate onto which the OLED devices are transported to build the end use device. Alternatively, the substrate 112 could sufficiently flexible for the end use.

The front-plane 110 includes a lower conductive layer 114a that can serve as an anode, an organic layer stack 116 that includes an emissive layer 126, and an upper conductive layer 114b that can serve as a cathode. As an anode, the lower conductive layer 114a is a patterned layer that during operation provides a positively charged electrical contact to the organic layer stack 116. The lower conductive layer 114a can optionally be a reflective material, e.g., a stack of materials such as a metal and indium tin oxide (ITO), with the metal being a conductive metal such as Ag or an alloy containing Ag and another metal such as Mg. The upper conductive layer 114b is transparent to allow the transmission of light generated by the front-plane 110. The upper conductive layer 114b can be, for example, ITO or a thin layer of a metal or alloy such as Ag or an alloy containing Ag and another metal such as Mg. In some implementations, the AgMg alloy can have a ratio of approximately 9:1 Ag to Mg.

A subpixel defining layer 115 can be deposited on the lower conductive layer 114a. The subpixel defining layer 115 can be formed of a dielectric material, e.g., a polymer such as a photoresist material. The apertures extend through the subpixel defining layer 115, and provide wells in which the OLED devices are formed. In particular, the organic layer stack 116 can be deposited over the bottom surface of the well. For example, the organic layer stack 116 can be disposed in spaces formed by the apertures e.g., using a fine metal mask (FMM). The lower conductive layer 114a is patterned to provide individual control of the OLED devices. The aperture permits the organic layer stack 116 to contact the lower conductive layer 114a or drive electrodes of the back-plane 113.

Figure 2A:
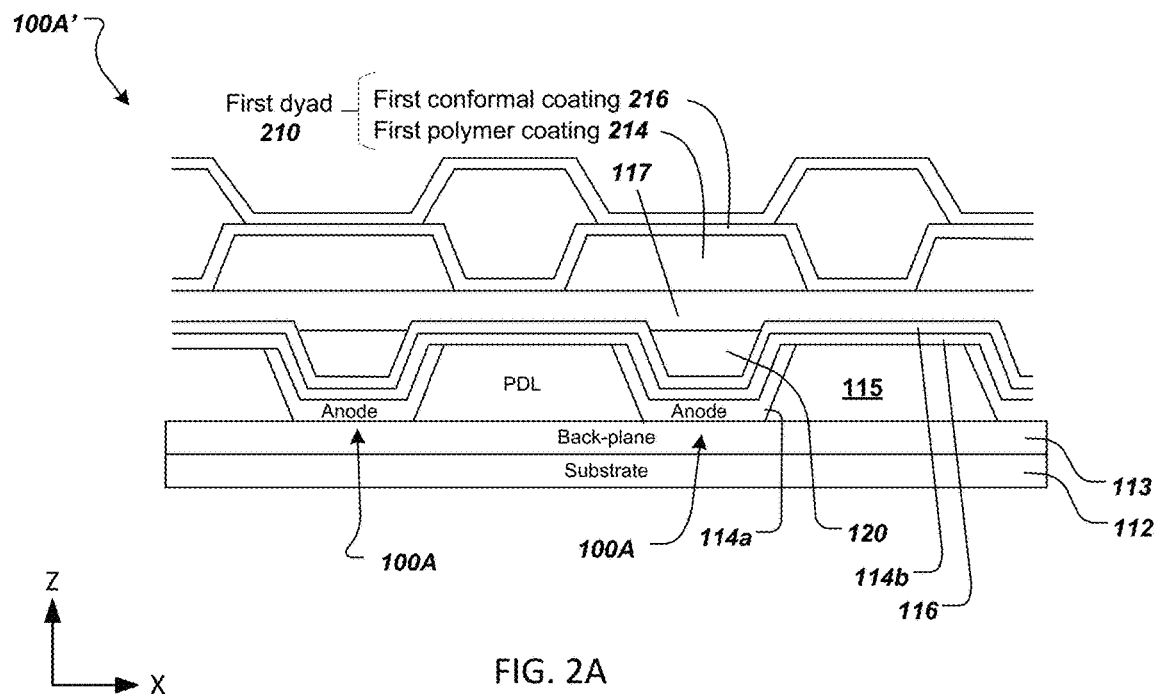
FIG. 2A is a schematic cross-sectional view of an OLED device that includes a subpixel defining layer.

FIG. 2A illustrates a portion of an OLED display 100A' that includes a subpixel defining layer 115 with apertures that define wells for the individual OLED devices 100A. The wells can have oblique side walls, and a mirror layer can be formed at the bottom of the well and partially or entirely along the side wall of the well. The mirror layer can be added to enhance the outcoupling of light from the OLED devices 100A. While in some embodiments, the anode of the OLED device is positioned at the bottom of the well formed between the subpixel defining layer, and extends underneath the subpixel defining layer without connecting to the anodes of adjacent subpixels. In other embodiments, an additional anode layer is patterned on top of the anode layer that extends underneath the subpixel defining layer.

The lower conductive layer 114a is deposited at least at the bottom of the well to contact the drive electrodes of the back plane 113. To provide the mirror, the lower conductive layer 114a can be a reflective layer, or the lower conductive layer 114a can be coated with a reflective layer, or the lower conductive layer 114a can be a transparent conductive layer formed over a reflective layer. The lower conductive layer can also be deposited on some or all of the side-walls provided by the apertures in the subpixel defining layer 115. As noted above, the lower conductive layer 114a is a patterned layer into discrete anodes that provide independent control of individual OLED devices 100A.

The organic layer stack 116 can be deposited over the lower conductive layer 114a and the portion of the subpixel defining layer that is not covered by the lower conductive layer 114a, e.g., on the side walls and top of the plateaus between the wells provided by the subpixel defining layer 115. Some layers of the organic layer stack 116 can span multiple OLED devices. The upper conductive layer 114b is deposited over the organic layer stack 116, and can be deposited as a continuous layer that spans multiple OLED devices. Disposed over the upper conductive layer 114b and at least partially filling each well is a light enhancing layer 120, e.g., an index matching material to improve the emission of light.

Figure 2B:
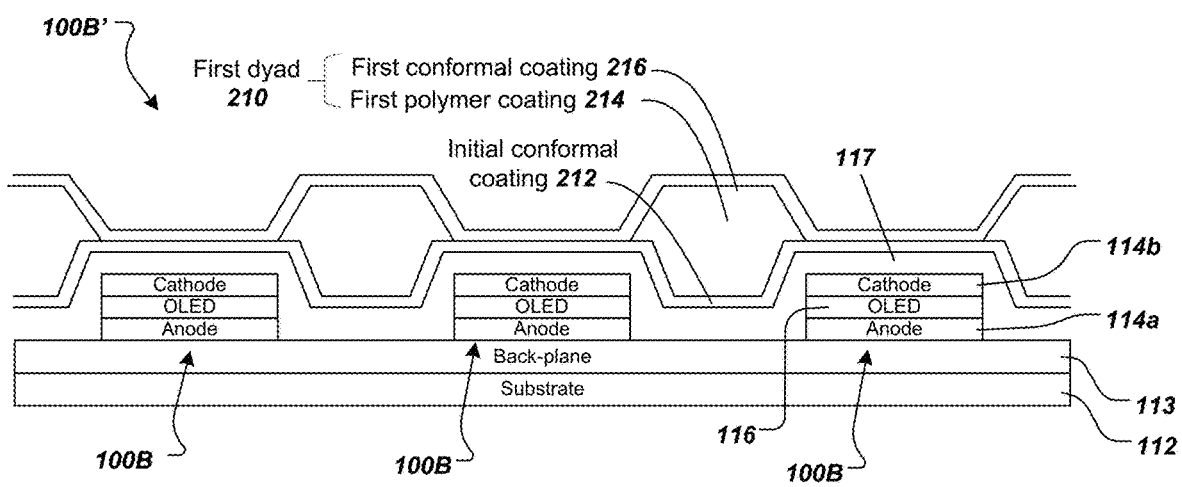
FIG. 2B is a schematic cross-sectional view of an OLED device.

Portions of the organic layer stack 116 in the apertures over the individual anodes of the lower conductive layer 114a thus provide the pixels or subpixels of the OLED display 100A'. That is, in some implementations, each OLED device 100A can provide a particular color of light, e.g., red, green or blue. FIG. 2B illustrates a portion of an OLED display 100B' in which the OLED devices 100B are formed directly on a backplane 113. Various electrically insulating layers (not illustrated) can be used to prevent shorting between the common cathode and other layers, e.g., the anode or metallization on the backplane 110. In some implementations, the OLED devices are formed without use of a subpixel defining layer 115. Although FIG. 2B illustrates the organic layer stack 116 and upper conductive layer 114b patterned with the same dimensions as the lower conductive layer 114a, this is not necessary. Disposed over the upper conductive layer 114b and remaining portion of the backplane 113 is a capping layer 117. Like the upper conductive layer 114b, the capping layer 117 can be deposited as a continuous layer that spans multiple OLED devices.

Returning to FIG. 1A, the organic layer stack 116 can include an electron injection layer (EIL) 120, an electron transport layer (ETL) 122, a hole blocking layer (HBL) 124, the light emissive layer (EML) 126, an electron blocking layer (EBL) 128, a hole transport layer (HTL) 130, and a hole injection layer (HIL) 132. Light is generated in the EML 126, e.g., through the recombination of positively charged holes, which travel to the EML from the lower conductive layer 114a, and negatively charged electrons, which travel to the EML from the upper conductive layer 114b.

The organic layer stack 116 is just one example of a multilayered stack of organic materials that can be used in a front-plane. In some implementations, an organic layer stack for a front-plane can include fewer layers than those included in organic layer stack 116, or more layers than those included in the organic layer stack. For example, one or more additional layers, an organic layer stack can include more than one HTLs, more than one HBLs, more than one EBLs, and/or more than one ETLs.

The organic layer stack 116, including the EML 126, can each be formed from a suitable organic material. For example, the organic material for the EML 126 can include light-emitting polymers, e.g., polyphenylene vinylene or polyfluorene. The organic material can include molecules that are smaller than light-emitting polymers, e.g., Alq3. The EML 126 can also include quantum dots or other light-emissive materials.

A capping layer 117, which can be an organic layer, can be deposited on the upper conductive layer 114b (as shown in FIG. 2A), or over the upper conductive layer 114b and exposed portions of the organic layer structure and/or backplane 113 (as shown in FIG. 2B). In some embodiments, the capping layer 117 is a dielectric layer, while in other embodiments the capping layer is formed from one or more organic semiconductor materials. The capping layer 117 can form the top layer of the front-plane 110. In some implementations, the capping layer 117 can serve as a planarization layer. In some implementations, the capping layer 117 can serve as a light-enhancement layer, e.g., one that performs index matching to improve outcoupling of light from the OLEDs. In some implementations, the capping layer 117 can partially fill apertures formed by the subpixel defining layer 115 (see FIG. 2A). In some implementations, the capping layer 117 can partially or entirely fill gaps between the OLEDs, e.g., partially or entirely fills in spaces between the organic layer stack 116, the lower conductive layer 114a, and the upper conductive layer 114b or adjacent OLEDs (see FIG. 2B).

The encapsulation 102 can be formed over the capping layer 117. The encapsulation 102 can include multiple layers of materials successively deposited on top of one another. For example, the encapsulation 102 can include multiple encapsulation sublayers. At least some of the encapsulation sublayers can be bilayers (sometimes referred to as dyads) that include a a polymer layer, e.g., of polymer dots, and a conformal coating that acts as a barrier layer formed over the polymer layer. For example, the encapsulation can include two or more bilayers, followed by a conformal inorganic dielectric coating.

The conformal coating can be a dielectric material, e.g., an inorganic material, such as $SiO_2$, $SiOxNy$, or $Al_2O_3$. The conformal coating can be deposited using any method suitable for depositing conformal thin-film layers of materials, e.g., using a chemical vapor deposition (ALD, CVD, PECVD, etc.) process or a physical vapor deposition (PVD) process. The thickness of the dielectric layer is approximately 1 µm or less (e.g., 0.8 µm or less, 0.6 µm or less, 0.4 µm or less, 0.2 µm or less, 0.1 µm or less, 0.05 µm or less, 0.02 µm or more, 0.05 µm or more). For example, the thickness can be 0.05 to 1 µm for a layer deposited by CVD, or 20 to 50 nm for a layer deposited by ALD.

The polymer layer can be formed of a liquid photopolymer adhesive, e.g., Norland Optical Adhesive 63 (NOA63), of polycarbonate (PC), polyphenylene sulfide (PPS), polyetherimide (PEI), polyethersulfone (PES), polyethylene terephthalate (PET), polydimethylsiloxane (PDMS), polyimide (PI), or silicone, of a photoresist, e.g., KMPR photoresist, or of a polystyrene (PS) array, such as PS with xylene or Parylene, such as Parylene C, D, or N.

In particular, following the capping layer 117 can be an optional initial conformal coating 102a of an inorganic dielectric material. For example, referring to FIG. 2B, an initial conformal coating 212 is deposited on the capping layer 117.

On the initial conformal coating 102a (see FIG. 1B), or on the capping layer 117 (see FIG. 2A), is an encapsulation sublayer (sometimes called a first dyad) that is a bilayer that includes a first polymer layer 102b, e.g., of polymer dots, and a first conformal coating 102c deposited on the first polymer layer 102b. In some implementations, the first polymer layer 102a can function as a planarization layer, and to create a layer that fills in any gaps formed by the subpixels of the front-plane 110. Additional layers of conformal coatings and polymer can be added on top of the first encapsulation sublayer.

In some embodiments, planarization of the wells formed between the subpixel defining layer 115 can be performed by depositing a polymer layer such that the polymer layer fills in the wells without the polymer layer overflowing beyond the wells. For example, in such an embodiment, the polymer planarization layer can be deposited such that this layer is substantially coplanar with the portions of the upper conductive layer 114b that are parallel to the xy-plane.

In other embodiments, the polymer planarization layer can overflow beyond the wells formed between the subpixel defining layer 115, such that portions of the polymer planarization layer extend or bulge above the portions of the upper conductive layer 114b that are parallel to the xy-plane. In such embodiments, subsequent layers, e.g., conformal coatings and/or additional polymer layers, can perform planarization over the bulges formed by the polymer planarization layer.

For example, a second encapsulation sublayer that is a bilayer including a second polymer layer 102*d*, e.g., of polymer dots, and second conformal coating 102*e*, e.g., of an inorganic dielectric material, can be deposited on top of the first encapsulation sublayer. Similarly, a third encapsulation sublayer that is a bilayer including third polymer layer, e.g., of polymer dots, and a third conformal coating, e.g., of an inorganic dielectric material, can be deposited on top of the second encapsulation sublayer, etc.

Referring to FIGS. 2A and 2B, a first encapsulation sublayer 210 is deposited on the initial conformal coating 212 (see FIG. 2B), or on the capping layer 117 (see FIG. 2A). The first encapsulation sublayer includes a first polymer layer 214 and a first conformal coating 216 deposited on the first polymer layer 214. Fabrication of this structure is described in greater detail below, with respect to FIGS. 3A-3D.

Returning to FIG. 1A, optionally, additional functional elements 111, e.g., polarization films, touch-sensitive components, a hard coating, etc., can be deposited on the encapsulation 102. In some implementations, one of more of the conformal coatings can serve as a hard coating, allowing for the omission of a hard coating as part of the functional elements 111.

Although the layers of the encapsulation 102 are illustrated in FIG. 1A as continuous planar layers, as explained below, at least some of the polymer layers are patterned. As a result, at least some of the conformal layers, i.e., those conformal layers disposed over the patterned polymer layer, have vertically extending portions. Without being limited to any particular theory, when the device is stretched, the vertically extending portions of the conformal layer can by splay outward while the polymer material is compressed.

Figure 3A:
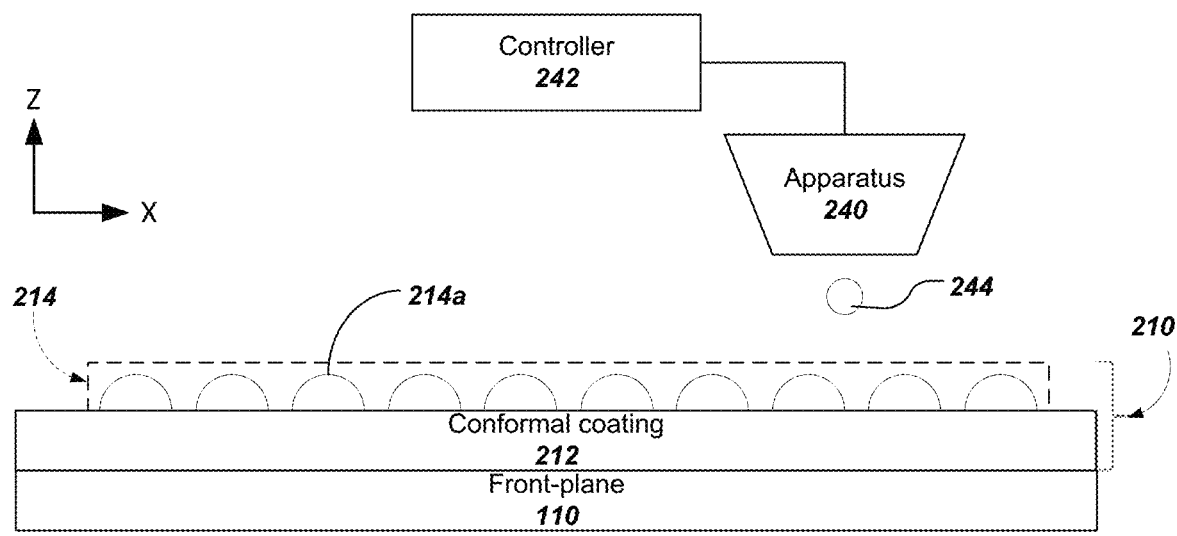
FIG. 3A illustrates a cross-sectional view of an initial conformal coating on a front-plane of an OLED device, with an initial polymer layer being deposited on the conformal coating.

Referring to FIG. 3A, in manufacturing of the OLED display, e.g., the display 100 of FIG. 1B, the encapsulation 102 is deposited on the front-plane 110.

FIG. 3A illustrates a cross-sectional view of the front-plane 110 with an initial conformal coating 212 deposited on the front-plane and a first polymer layer 214 deposited on the initial conformal coating. The substrate 112 and back-plane 113 are omitted from FIG. 3A for simplicity.

The conformal coating 212 can be a layer of dielectric material that is deposited on top of the front-plane 110, e.g., deposited on top of the capping layer 117 of the front-plane. The first conformal coating 212 extends in the x and y-directions and can be deposited using a chemical vapor deposition process (e.g., CVD, PECVD, ALD) or a physical vapor deposition process (PVD).

The first polymer layer 214, enclosed by broken lines, extends in the x and y-directions in a layer that sits on top of the initial conformal coating 212. The first polymer layer 214 can include polymer dots 214*a*. Because previous layers of the OLED display 100 can provide planarization, e.g., a light enhancement layer, other polymer planarization layer, or other layer of the light-emitting elements of the front-plane 110, the polymer dots 214*a* form a plane that extends in the x and y-directions.

As shown in FIG. 3A, the polymer dots 214*a* can be substantially semispherical, although other shapes are possible, e.g., trapezoidal or rectangular. The flat face of each polymer dot 214*a* is in contact with the initial conformal coating 212. Alternatively, in some implementations the flat face of each polymer dot 214*a* is in contact with the front-plane 110.

The first polymer layer 214 with the polymer dots 214*a* can extend across the surface of the front-plane 110, e.g., such that an array of polymer dots is deposited on the top surface of the structure, extending in the x and y-directions. Adjacent polymer dots 214*a* are spaced apart by a gap. As such, the polymer dots 214*a* do not contact one another. The polymer dots can be distributed with uniform spacing at least across the regions of the front-plane 110 that will provide the display, e.g., across the entire workpiece. The polymer dots 214*a* can be distributed in a hexagonal pattern, although other patterns, such as rectangular patterns, are possible.

The polymer dots 214*a* can be deposited by a droplet ejection printer 240, similar to an inkjet printer, which is coupled to a controller 242. In particular, droplets 244 can be controllably ejected from one or more nozzles onto the initial conformal coating 212 in a desired pattern. The droplet can then be cured, e.g., by UV radiation from a UV light source. An advantage of droplet ejection printing is that a printhead can include multiple nozzles in one or more rows that span a width of the workpiece, and the printhead can be driven along the length of the workpiece while droplets are controllably ejected. This permits quick fabrication of the polymer layer 214.

Figure 4:
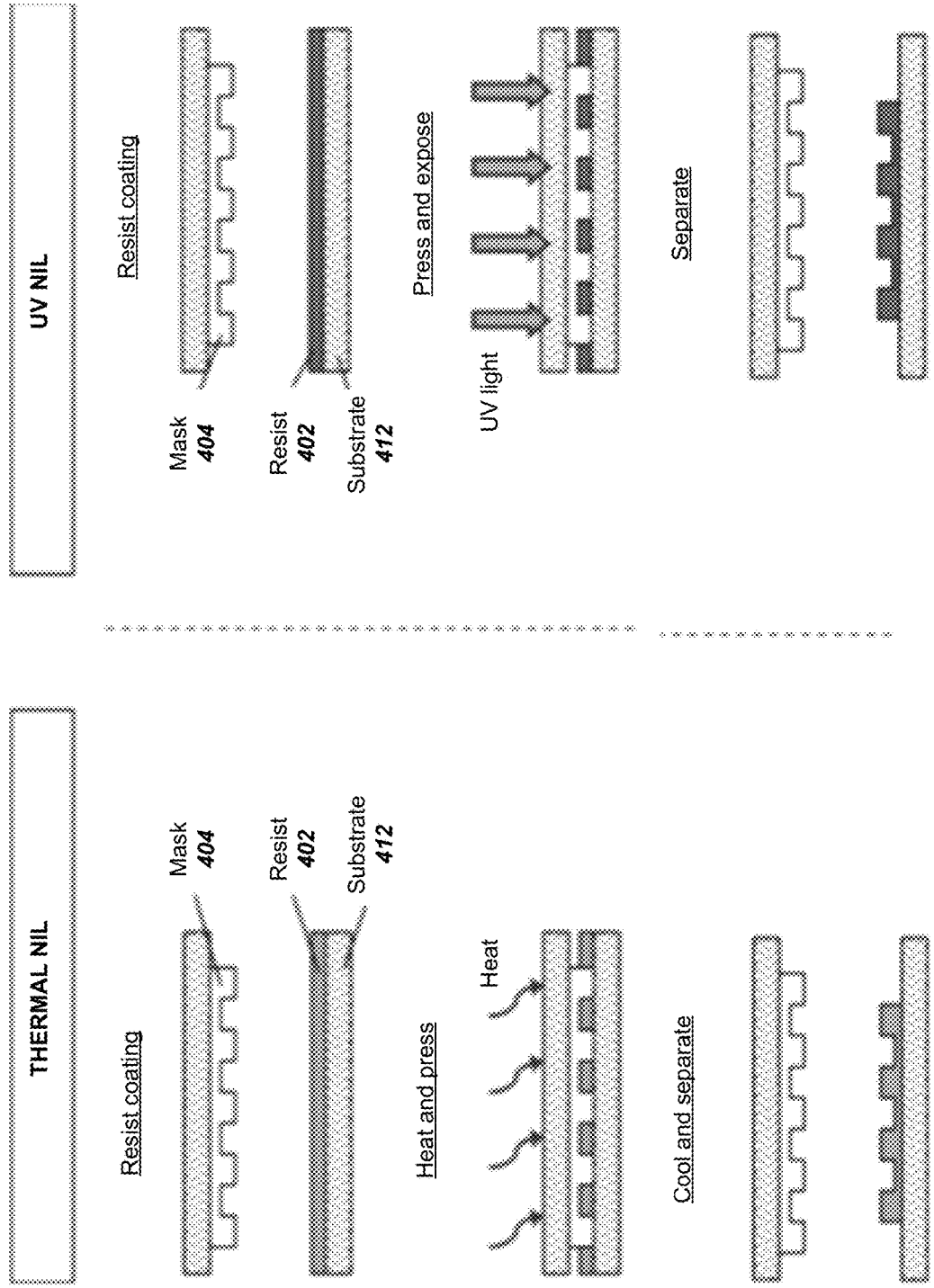
FIG. 4 illustrates a thermal NIL process and UV NIL process for depositing features on a substrate.

Alternatively, the polymer layer 214 can be deposited by other suitable processes, e.g., a nano- or micro-imprint lithography (NIL or MIL) process that deposits the polymer features. The described processes may involve multiple imprinting, e.g., to form a repeated structure of features, and control over the alignment of features, e.g., to ensure a consistent spacing of features relative to each other. Referring to FIG. 4, in both of these NIL/MIL processes, a substrate 412, i.e., the substrate 112 with the front-plane 110 and back-plane 113 thereon, is coated with a resist 402, e.g., a thermoplastic polymer resist or photopolymer resist, depending on the type of process. A mold or mask 404 is applied to the resist 402 and the mold and resist are then exposed to heat (for thermal NIL/MIL), or ultraviolet light (for UV NIL/MIL). In some implementations, for thermal NIL/MIL processes, the temperature at which the resist 402 and mask 404 are heated can be above the glass transition temperature of the photoresist. In some implementations, for thermal NIL/MIL processes, the temperature can range from about 80° C. to about 100° C. For UV NIL/MIL processes, the resist 402 and mask 404 can be exposed to UV light while at room temperature. In other implementations, the temperature range for UV NIL/MIL processes can be about 80° C. to about 100° C. Exposing the resist 402 to heat or light causes the resist to be cured and set. When the mold 404 is removed, the top surface of the resist 402 bears a negative imprint of the mold. The resist 402 thus provides the polymer layer 214.

NIL/MIL can provide certain advantages over other processes, e.g., those that include a droplet injection printer. For example, NIL/MIL processes can be faster than other feature deposition processes. As another advantage, NIL/MIL processes can create a greater range of patterns compared to other processes. For example, NIL/MIL processes can enable the fabrication of vertically extending side walls.

Returning to FIG. 3A, where droplet ejection is used to deposit polymer layers, the controller 242 is communicatively coupled to the droplet ejection printer 240 and controls aspects of the deposition process. For example, the controller 242 can control the size of the features that are deposited by droplet ejection printer 240, e.g., by controlling the size or number of droplets 242 ejected, the placement of the features that are deposited, i.e., the x, y, or z-locations of the features, e.g., by controlling the timing of the ejection of the droplets as the printhead scans across the workpiece, or the type of material that is deposited by the controller, e.g., by controlling which printhead performs ejection.

Figure 3B:
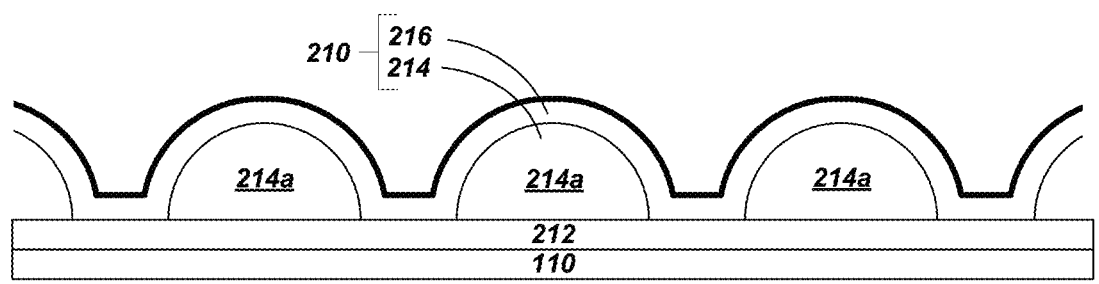
FIG. 3B illustrates a cross-sectional view of the device of FIG. 3A with a first encapsulation sublayer formed on the initial conformal coating.

As shown in FIG. 3B, the first conformal coating 216 is deposited over the first polymer layer 214 and exposed portions of the initial conformal coating (or exposed portions of the capping layer 117 or front-plane 110, e.g., a light enhancement layer or other layer of the light-emitting elements of the front-plane. The combination of the first polymer layer 214 and the first conformal coating 216 provides the first dyad 210.

Figure 3C:
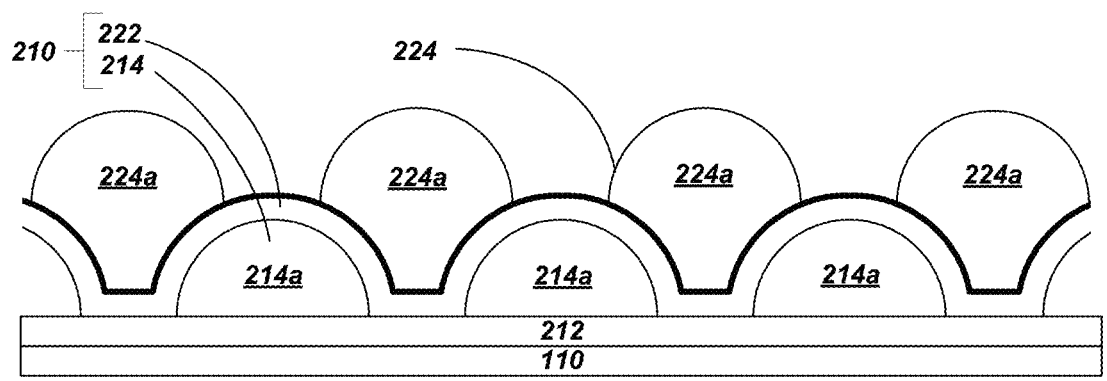
FIG. 3C illustrates a cross-sectional view of the device of FIG. 3A with a first encapsulation sublayer formed on the initial conformal coating.

FIG. 3C illustrates a cross-sectional view of the front-plane 110 and the first encapsulation sublayer 210, with the addition of a second polymer layer 224. The second polymer layer 224 includes polymer dots 224a that are deposited on top of the conformal coating 216.

Each polymer dot 224a of the second polymer layer 224 can have an upper portion which has a convex top surface, e.g., each polymer dot 224a can have a substantially hemispherical top portion. In the implementation illustrated in FIG. 3C, each polymer dot 224a can also include a bottom portion that fills a gap between the polymer dots 214a of the underlying dyad 210. However, as described below, other configurations are possible. The convex top surface of the polymer dot 224a of the second polymer layer 224 can project above the top surface of the conformal coating 216. The second polymer layer 224 can be deposited by droplet ejection or a NIL/MIL process.

Figure 3D:
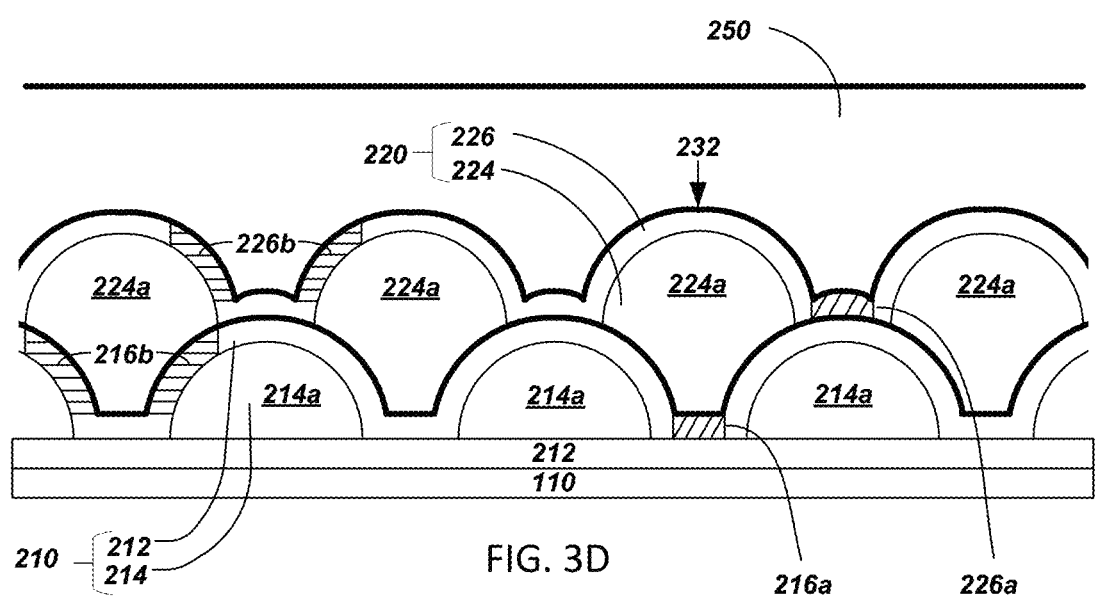
FIG. 3D illustrates a cross-sectional view of the device of FIG. 3B with a second encapsulation sublayer formed on the first encapsulation sublayer.

As shown in FIG. 3D, a second conformal coating 226 is deposited over the second polymer layer 224. The combination of the second polymer layer 224 and the second conformal coating 226 provides a second dyad 220. Similar to the first encapsulation sublayer 210, the second encapsulation sublayer 220 is formed by depositing a second polymer layer 222 on top of the first conformal coating 212, followed by the deposition of the second conformal coating 224 on top of the second polymer layer 222. Although FIG. 3D illustrates two layers of polymer dots, in some embodiments, additional layers of polymer dots can be deposited. For example, an additional polymer layer can be deposited on top of the second conformal coating 224 and an additional conformal coating can be deposited on top of the additional polymer layer. In some embodiments, such an additional polymer layer and additional conformal coating may be needed to fully cover the substrate.

In some implementations, an additional polymer layer 250 covers the outermost conformal coating. The additional polymer layer 250 can be thicker than the polymer layers and/or conformal coatings of the encapsulation sublayers. In some implementations, the additional polymer layer 250 can be deposited conformally, while in other implementations the additional polymer layer 250 can be deposited non-conformally, e.g., such that the additional polymer layer has a substantially flat outer surface. The functional elements 111 can be formed on the additional polymer layer. The polymer dots of any one of the first or second polymer layers 214 or 224 are separated by respective conformal coatings. A portion of the conformal coating 216 contacts a portion of the initial conformal coating 212 of the below first encapsulation sublayer 210. Similarly, a portion of the second conformal coating 226 of the second encapsulation sublayer 220 contacts a portion of the first conformal coating 216.

The portions of the conformal coatings 216 and 226 that contact the conformal coatings 212 and 216, respectively, can be referred to as "horizontal" portions of the conformal coatings because they extend over the top surface of the immediately underlying conformal coating that is generally horizontal. Conformal coatings 216 and 226 include horizontally portions 216a and 226a, respectively. The portions 216b, 226b of the conformal coatings 216, 226 that are not in contact with a portion of another conformal coating can be referred to as "vertically extending" portions of the conformal coating because they extend along side walls of the underlying polymer dots and extend partially or entirely vertically. In general, the vertically extending portions can form an angle of at least 45° relative to the top surface of the front-plane 110.

The conformal coatings 216, 226, also form side walls along sides of the polymer dots 214a and 224a, respectively. The conformal coatings 216 and 226 form the side walls 216b and 226b, respectively, which are emphasized by shading. The side walls 216b and 226b define wells in spaces between the side walls. The polymer layer 224 can completely fill the wells defined by side walls 226b.

In some embodiments, one or more additional layers can be added to fill the wells defined by side walls 226b. For example, an additional polymer layer can be deposited on top of the conformal coating 226 and an additional conformal coating can be deposited on top of the additional polymer layer. The additional polymer layer can form a surface that is approximately coplanar with the xy-plane. That is, the additional polymer layer can be a planarizing surface. The additional conformal coating can be a dielectric layer that can perform permeation blocking for the underlying polymer and conformal coating layers.

In some implementations, the wells defined by the side walls 216b are only partially filled by the polymer layer 224. In some implementations, the side walls 226b are only partially filled by any additional polymer layers that are deposited on the conformal coating 226.

An encapsulation sublayer can also be referred to as a dyad. That is, a dyad can include a polymer layer and an inorganic dielectric layer. The OLED device illustrated in FIG. 3D includes an initial conformal coating and two full dyads, i.e., the first and second encapsulation sublayers 210 and 220. Therefore, the OLED device illustrated in FIG. 3D can be referred to as a "2.5 dyad" device. The OLED device illustrated in FIG. 2A can be referred to as a "2 dyad" device, and the OLED device illustrated in FIG. 2B can be referred to as a "1.5 dyad" device. Having a conformal coating as the final layer deposited in the encapsulation 102 provides certain advantages, e.g., ensuring that the polymer features of the encapsulation remain where they were deposited. Therefore, while dyad devices higher than 2.5 are also possible.

Figure 5A:
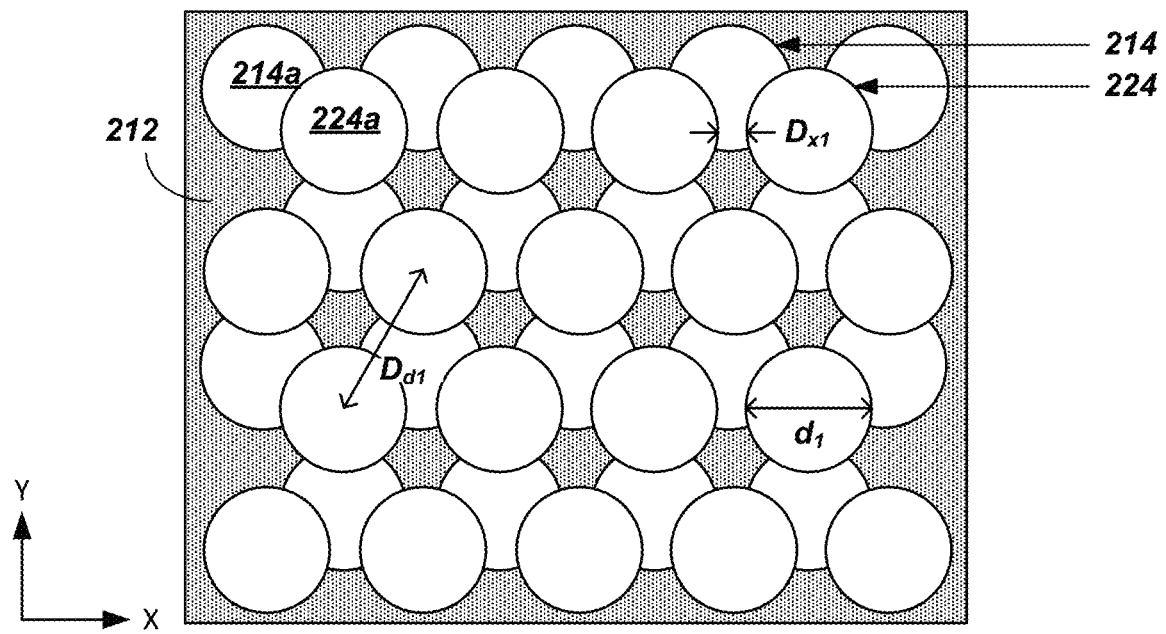
FIGS. 5A and 5B illustrate top views of the flexible polymer layers of FIG. 2C.

FIG. 5A illustrates a top view of an encapsulation that includes the first and second polymer layers 214 and 224 with the polymer dots 214a, 224a in a hexagonal close-packed structure. Polymer dots 214a and 224a of the polymer layers 214 and 224 are included to show the positions of the polymer dots of each polymer layer, relative to the polymer dots of the adjacent layer. The polymer dots of the second polymer layer 224 can be positioned over spaces between the polymer dots in the first polymer layer 214. Conformal coatings 222 and 232 are omitted from FIG. 5A to better show the first and second polymer layers 214 and 224.

FIG. 5A shows a distance d1, which is the diameter of each dot. The diameter d1, can be approximately 120 µm or less (e.g., 115 µm or less, 110 µm or less, 105 µm or less, 100 µm or less). The diameter d1 can be chosen according to the dimensions of the pixels of the OLED display. For example, when a pixel's footprint (lateral dimension) is viewed in the xy-plane, d1 can be chosen such that the footprint of the dot in the xy-plane approximately corresponds to the pixel's footprint. The pitch between the polymer dots can be about the same as the pitch between the pixels. The edges of the polymer dots can be aligned with gaps between subpixels, although this is not required.

FIG. 5A also shows a distance Dx1, measured in the x-direction, which is the distance between edges of neighboring polymer dots of either the first or second polymer layers 214 and 224, as measured along a line that passes through the centers of the neighboring polymer dots. The distance Dx1 can be approximately 90 μm or less (e.g., 80 μm or less, 70 μm or less, 60 μm or less). In some implementations, the distance Dx1 can be less than $d_1$ (2 cos(30)−1), e.g., approximately 0.73d1 or less.

FIG. 5A also shows a distance Dd1, measured diagonally, between the centers of neighboring polymer dots of either the first or second polymer layers 214 and 224. The distance Dd1 can be approximately 210 μm or less (e.g., 190 μm or less, 170 μm or less, 150 μm or less, 130 μm or less, 110 μm or less, 90 μm or less, 70 μm or less, 50 μm or less). In some implementations, the distance Dd1 can be approximately $2d_1 \cos(30)$, e.g., approximately 1.73d1.

In some implementations, a third polymer layer can be deposited on top of the second polymer layer 224. For example, just like the configuration of the first and second polymer layers 214 and 224, the third polymer layer can form the same hexagonally-packed configuration. As a result of the configuration of the polymer dots of the first and second polymer layers 214 and 224, and the polymer dots of the third polymer layer, each of the empty spaces between three polymer dots of the first polymer layer 214 have a corresponding polymer dot of the third polymer layer positioned above the empty space. That is, when viewed from above, as in the planar view of FIG. 5A, when each polymer dot is deposited, no empty spaces can be seen between the polymer dots of the first polymer layer 214. Accordingly, when each polymer dot of the third polymer layer is deposited, most or all of the conformal layer 212 is obscured or encapsulated by the three polymer layers.

Figure 5B:
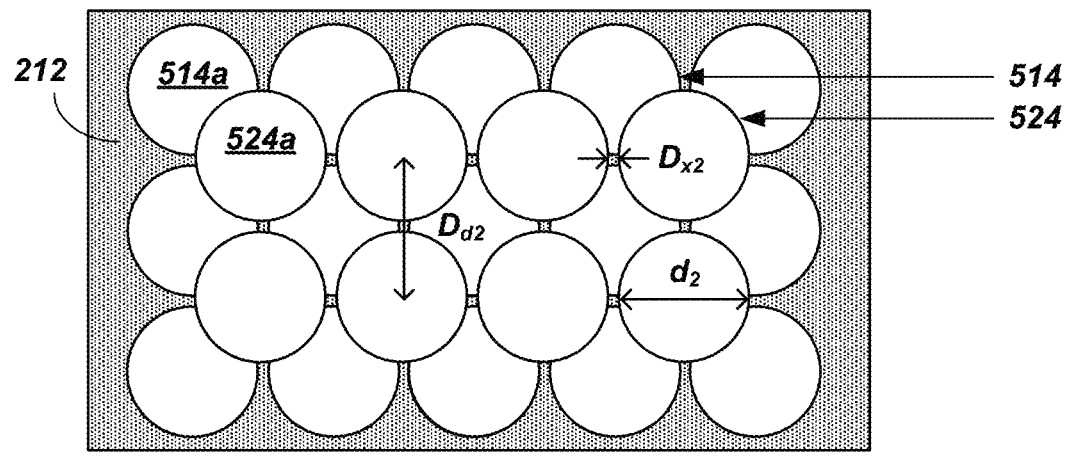

In some implementations, instead of being configured in a hexagonal configuration, as shown in FIG. 5A, the polymer dots of the polymer layers are configured in a rectangular configuration, e.g., a configuration having orthogonal rows and columns of polymer dots. FIG. 5B illustrates a top view of an example rectangularly-packed encapsulation, which includes the conformal coating 212, a first polymer layer 514, and a second polymer layer 524. Polymer dots 514a and 524a of the polymer layers 514 and 524 are included to show the positions of the polymer dots of each polymer layer, relative to the polymer dots of the adjacent layer. The polymer dots of the second polymer layer 524 are positioned over spaces between the polymer dots in the first polymer layer 514. A separate conformal coating covers each of the first and second polymer layers 514 and 524, although the conformal coatings are omitted from FIG. 5B to better show the first and second polymer layers 514 and 524.

FIG. 5B shows a distance d2, which is the diameter of each dot. The diameter d2, can be approximately the same as the diameter d1. Like d1, d2 can be chosen according to the dimensions of the pixels of the OLED display.

FIG. 5B also shows a distance Dx2, measured in the x-direction, which is the distance between edges of neighboring polymer dots of either the first or second polymer layers 514 and 524, as measured along a line that passes through the centers of the neighboring polymer dots. The distance Dx2 can be approximately 50 μm or less (e.g., 40 μm or less, 30 μm or less). In some implementations, the distance Dx2 can be less than $d_2$ ($\sqrt{2}-1$), e.g., approximately 0.4d2 or less.

FIG. 5B also shows a distance Dd2, which is the distance between the centers of polymer dots of the same polymer layer and in the same row or column. The distance Dd2 can be approximately 170 μm or less (e.g., 160 μm or less, 150 μm or less, 140 μm or less, 130 μm or less). In some implementations, the distance Dd2 can be less than $d2\sqrt{2}$, e.g., approximately 1.4d2 or less.

While the polymer dots of the same polymer layer 214, 224, 514, or 524 as shown in FIGS. 5A and 5B do not touch one another, in some implementations, polymer dots of the same polymer layer can touch one another. For example, when polymer dots are arranged in a hexagonal, touching configuration, a single polymer dot can touches up to six dots of the same polymer layer. In some implementations, the polymer dots of the same polymer layer are arranged in a rectangular, touching configuration. When polymer dots are attached in a rectangular, touching configuration, a single polymer dot touches up to four polymer dots of the same polymer layer. An advantage of discrete dots that are separated on all sides is that the conformal dielectric coating extends vertically along the entire height of the polymer dot, increasing the length of the side wall and increasing the flexibility of the encapsulation.

When the OLED display 100' is deformed, e.g., bent in the z-direction or stretched in the x and/or y-directions, the front-plane 110, functional elements 111, substrate 112, back-plane 113, and the encapsulation 102 are also deformed. In particular, when the OLED display 100' is deformed, the vertical portions 216b and 226b of the conformal coatings 216 and 226 can splay outward, e.g., in the x and/or y-directions, while the polymer dots 214a, 224a are compressed and squished outward. This can permit the inorganic material of the conformal coating to stretch or flex without significant risk of damage, while the total length of the conformal coatings remains roughly constant.

In addition, when the encapsulation 102 is deformed, the distance between the polymer dots can increase. When the distance between each polymer dot increases, the positions in the z-directions of the polymer dots of the second polymer layer 224 may change. However, because the conformal coating 212 coats the front-plane 110, the front-plane is not exposed when the OLED device 100A is bent or stretched.

When the OLED display 100' is bent in the z-direction, the substrate 112, the front-plane 110, and the encapsulation 102 is also deformed. The change in distance between polymer dots can increase, similarly to the change in distance described above. The deformation of the encapsulation sublayers 210 and 220 are such that a polymer dot of the polymer layer 224 remains above the empty space between any three polymer dots of the polymer layer 214.

Despite the reduced risk of damage, sufficiently intense or repetitive stretching or bending may cause fractures in one or more of the conformal coatings 212, 216, and 226. The areas of the conformal coatings that are most susceptible to fractures may be the vertical portions 216b, 226b, because of how the vertical portions are stretched or bent when the OLED display 100' is stretched or bent. While such a fracture may be rare, the conformal coating 212 may fracture at the vertical portions 216b, 226b. However, the structure of the encapsulation 102 ensures that an additional conformal coating is present between the fracture and the front-plane.

Moreover, even if multiple fractures occur, the staggered configuration of the polymer dots provides an increased path length to the front-plane.

Figure 6A:
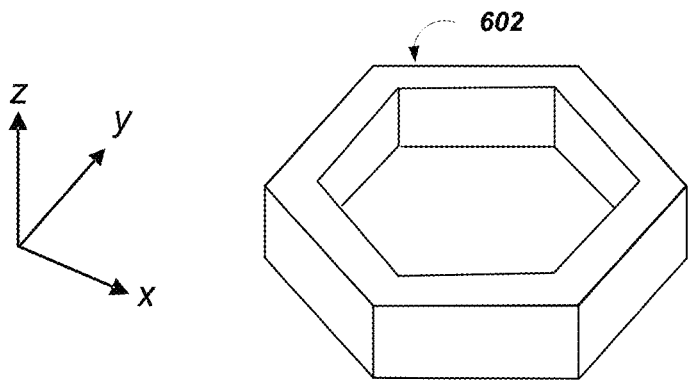
FIG. 6A illustrates a perspective view of a polymer subunit that can be deposited on top of the front-plane of a OLED display.
Figure 6B:
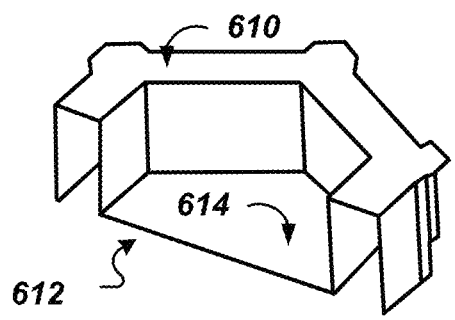
FIG. 6B illustrates a perspective view of the polymer subunit of FIG. 6A coated by a conformal coating to form an encapsulation cell.
Figure 6C:
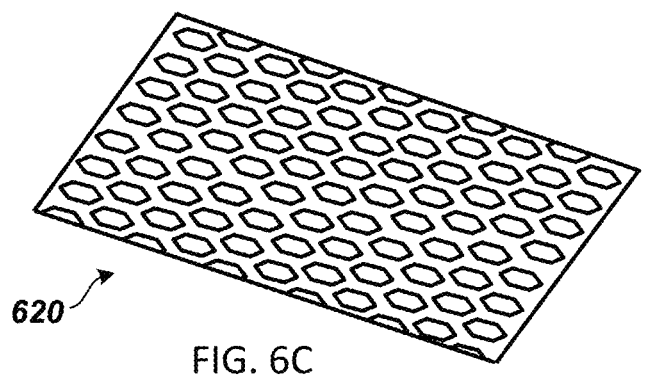
FIG. 6C illustrates a perspective view of multiple encapsulation cells positioned next to one another to form a first encapsulation sublayer.

FIGS. 6A-6C illustrate another example encapsulation method and structure that can be used to protect the front-plane 110. Another example encapsulation can be formed by depositing a pattern of polymer sub-units on top of the front-plane 110 to form a first patterned polymer layer. Following the patterned polymer layer, a conformal coating can be deposited, the patterned polymer layer and conformal coating together forming a first encapsulation sublayer. A second encapsulation sublayer can be formed by depositing a second patterned polymer layer on top of the first conformal coating, followed by depositing a second conformal coating on top of the second patterned polymer layer. A third encapsulation sublayer that includes a third patterned polymer layer and a third conformal coating can be deposited on top of the second encapsulation sublayer. The first patterned polymer layer can planarize the surface of the front-plane 110. The subsequent patterned polymer layers, e.g., the second and third patterned polymer layers can also serve as planarization layers prior to the deposition of additional layers, e.g., conformal layers or functional elements.

FIG. 6A illustrates a perspective view of a polymer subunit 602 that can be deposited on top of the front-plane 110. The polymer subunit 602 can be annular, i.e., has an aperture therethrough. The width of the annulus can be generally uniform.

In the example of FIG. 6A, the polymer subunit 602 is a three-dimensional subunit having a substantially hexagonal shape when viewed from above, i.e., when the viewing direction is along the z-axis. The polymer subunit 602 forms an annular shape with the six-sides of hexagonal subunit forming six sidewalls. However, other annular shapes are possible, e.g., circular rings, square or rectangular annulus, etc. The polymer subunit 602 can be formed from the same material or materials that form the polymer dots of FIGS. 3A-3D. In addition, the polymer subunit 602 can be deposited by similar process, e.g., MIL/NIL.

While FIG. 6A illustrates a single polymer subunit 602, FIG. 6B illustrates the polymer subunit coated by a conformal coating 610 to form an encapsulation cell 612. The conformal coating 610 can be formed from the same material or materials that form the conformal coatings of FIGS. 3A-3D, e.g., a dielectric material. In addition, the conformal coating 610 can be deposited by similar process, e.g., a vapor deposition process. The conformal coating 610 forms a bottom surface layer 614 extending in the x and y-directions and having a hexagonal shape when viewed from above. Accordingly, the encapsulation cell 612 forms a cup that includes side walls and the bottom surface layer 614.

While FIG. 6B illustrates a perspective view of a single encapsulation cell 612, FIG. 6C illustrates a perspective view of multiple encapsulation cells positioned next to one another to form a first encapsulation sublayer 620. The first encapsulation sublayer 620 is a lattice of encapsulation cells that together form a structure that is similar in shape to a honeycomb. While omitted from FIG. 6C to better show the honeycomb lattice, the first encapsulation sublayer further includes a planarizing polymer layer disposed over the lattice of encapsulation cells.

Figure 7A:
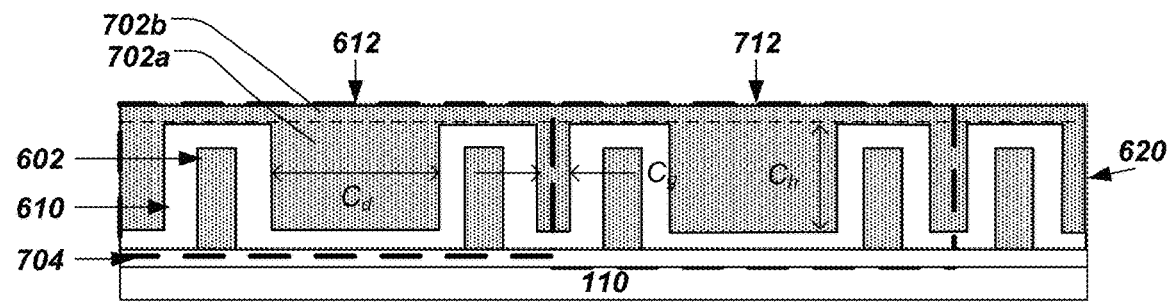
FIG. 7A illustrates a cross-sectional view of the front-plane and substrate as covered by the first encapsulation sublayer of FIG. 6C.

Whereas FIG. 6A illustrates a perspective view of a single cell for an encapsulation sublayer 620, FIG. 7A illustrates a cross-sectional view of the first encapsulation sublayer which includes two adjacent encapsulation cells 612, 712. FIG. 7A further includes the front-plane 110 with an initial conformal coating 704 deposited over the front-plane, e.g., deposited over the capping layer 117 of the capping layer. The conformal coating 704 can be an inorganic dielectric layer, e.g., as described for initial conformal coating 212.

Each encapsulation cell 612 and 712 includes a polymer subunit, a portion of a conformal coating, and a planarizing polymer layer. For example, referring to encapsulation cell 612, FIG. 7A includes the polymer subunit 602, the conformal coating 610, and a planarizing polymer layer 702a. Because polymer layer 702a is a planarizing layer, it may be thicker, as measured in the z-direction, than subsequently deposited polymer layers. The planarizing polymer layer 702a can fill the inner recess that is surrounded by the annular polymer subunit 602, as well as fill the spaces between adjacent polymer subunits 602. This facilitate the deposition of additional encapsulation sublayers. In addition, an optional planarizing separating polymer layer 702b can be disposed over the conformal coating 610 and a planarizing polymer layer 702a. This provides separation between the conformal coatings of different encapsulation layers.

Both encapsulation cell 612 and encapsulation cell 712 are emphasized by heavy dashed lines. Each encapsulation cell has a diameter, measured in the x-direction, which is labeled Cd in FIG. 7A. Each encapsulation cell also has a height, measured in the z-direction, which is labeled Ch in FIG. 7A. The gap between each encapsulation cell is labeled Cg.

The dimensions, e.g., the diameter, height, and cell gap with respect to encapsulation cells of the first, second, or third encapsulation sublayers can be approximately the same. The diameter, Cd, is approximately 1000 µm or less (e.g., 980 µm or less, 960 µm or less, 940 µm or less, 920 µm or less, 900 µm or less). The height, Ch, is approximately 5 µm or less (e.g., 4.75 µm or less, 4.5 µm or less, 4.25 µm or less, 4 µm or less, 3.75 µm or less). The gap between neighboring encapsulation cells, Cg, is approximately 90 µm or less (e.g., 85 µm or less, 80 µm or less, 75 µm or less, 70 µm or less). The dimensions of the encapsulation cells may change depending on the pixel density.

The diameter Cd can be chosen according to the dimensions of the pixels of the OLED display. In some implementations, when a pixel's footprint is viewed in the xy-plane, Cd can be chosen such that the footprint of the encapsulation cell in the xy-plane approximately corresponds to the pixel's footprint. That is, Cd can be approximately equal to the x or y dimension of the pixel. In other implementations, Cd is an integer multiple of the x or y dimension of the pixel.

Figure 7B:
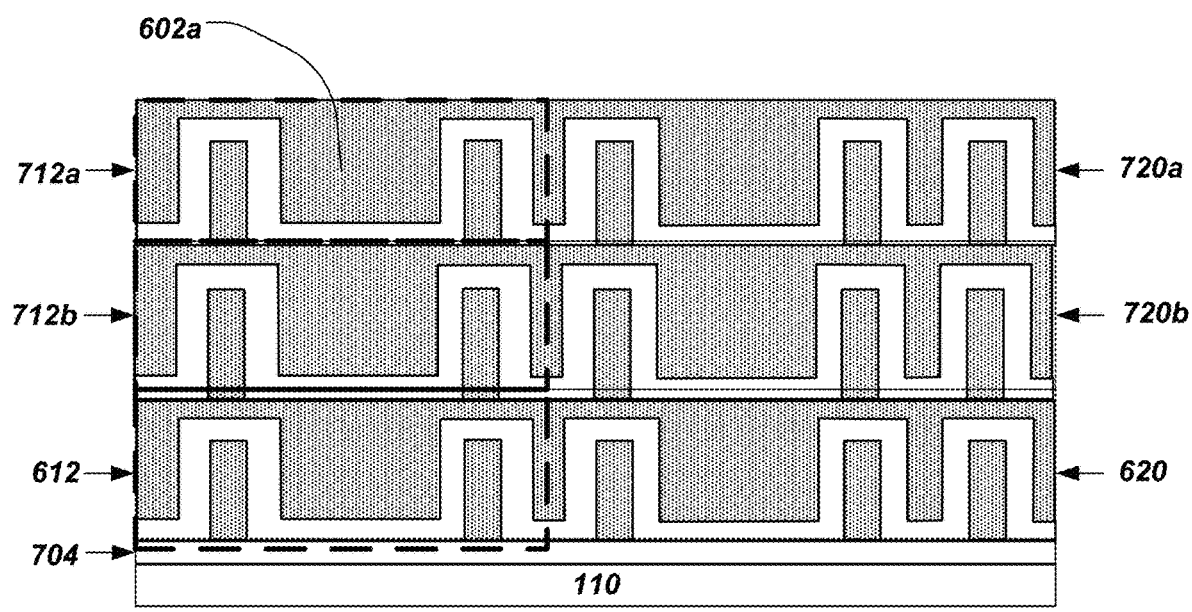
FIG. 7B illustrates a cross-sectional view of the front-plane and substrate as covered by an encapsulation that includes three encapsulation sublayers in an aligned configuration.

While the first encapsulation sublayer 620 can be used to encapsulate the front-plane 110, including additional encapsulation sublayers in an encapsulation results in increased protection and durability. FIG. 7B illustrates a cross-sectional view of the front-plane 110, substrate 112, and three encapsulation sublayers in an aligned configuration. FIG. 7B illustrates the encapsulation sublayer 620 and a third and second encapsulation sublayer 720a and 720b, each emphasized by dotted lines. The encapsulation sublayer 620 includes the encapsulation cell 612, and the encapsulation sublayers 720a and 720b include encapsulation cells 712a and 712b, respectively. Each encapsulation cell 612, 712a, and 712b is emphasized by heavy dashed lines. The encapsulation sublayers of FIG. 7B are said to be aligned because each encapsulation cell is aligned either directly above, directly below, or both directly above and directly below another encapsulation cell of a different encapsulation sublayer. For example, an encapsulation cell 712b of the second encapsulation sublayer 720b is aligned directly above the encapsulation cell 612 of the first encapsulation sublayer 620, and aligned directly below an encapsulation cell 712a of the third encapsulation sublayer 720a.

Figure 7C:
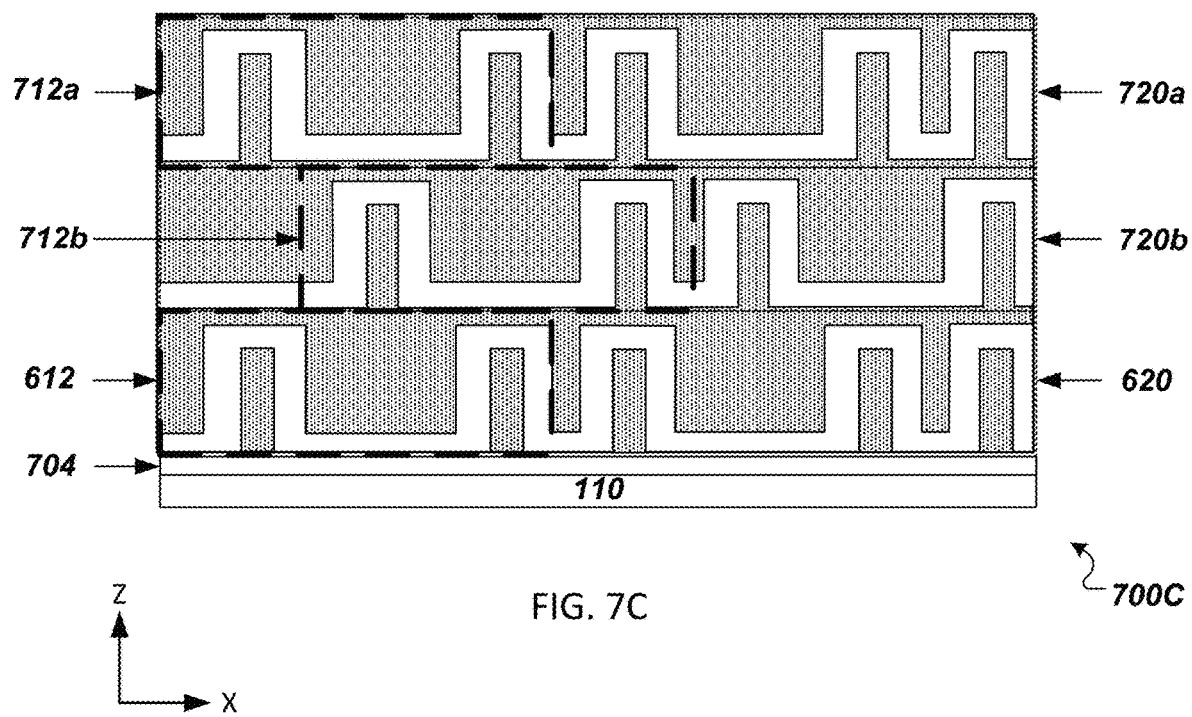
FIG. 7C illustrates a cross-sectional view of the front-plane and substrate as covered by an encapsulation that includes three encapsulations sublayers in an unaligned configuration.

While FIG. 7B illustrates a cross-sectional view of an encapsulation 700B that includes the three cells of the encapsulation sublayers 620, 720a, and 720b, in an aligned configuration, FIG. 7C illustrates a cross-sectional view of an encapsulation 700C in which the cells of the three encapsulation sublayers 620, 720a, and 720b are in an unaligned configuration. In particular, FIG. 7C illustrates the cells of the three encapsulation sublayers 620, 720a, and 720b in a staggered configuration. Instead of each encapsulation cell being aligned directly above, directly below, or both directly above and directly below another encapsulation cell, as in FIG. 7B, only some encapsulation cells are aligned above or aligned below another encapsulation cell. For example, the encapsulation cell 612 is aligned below the encapsulation cell 712a, but not directly below, because the encapsulation cell 712b separates the encapsulation cells 612 and 712a.

In the example of FIG. 7C, although the three encapsulation structures 620, 720a, and 720b are in an unaligned configuration, the encapsulation cells of the first and third encapsulation sublayers 620 and 720a are approximately aligned. In other implementations, when an encapsulation is formed by encapsulation sublayers 620, 720a, and 720b, the encapsulation sublayers are in a completely unaligned configuration. When the encapsulation sublayers are completely unaligned, none of the encapsulation cells of the encapsulation sublayers 620, 720a, and 720b are aligned.

In the example of FIG. 7C, the gaps between neighboring encapsulation cells of the second encapsulation sublayer 720b are approximately aligned with the centers of encapsulation cells of the first and third encapsulation sublayers 620 and 720a although in other implementations, the gaps between neighboring encapsulation cells of second encapsulation sublayer 720b are not aligned with the centers of encapsulation cells of the first and third encapsulation sublayers 620 and 720a.

Figure 8:
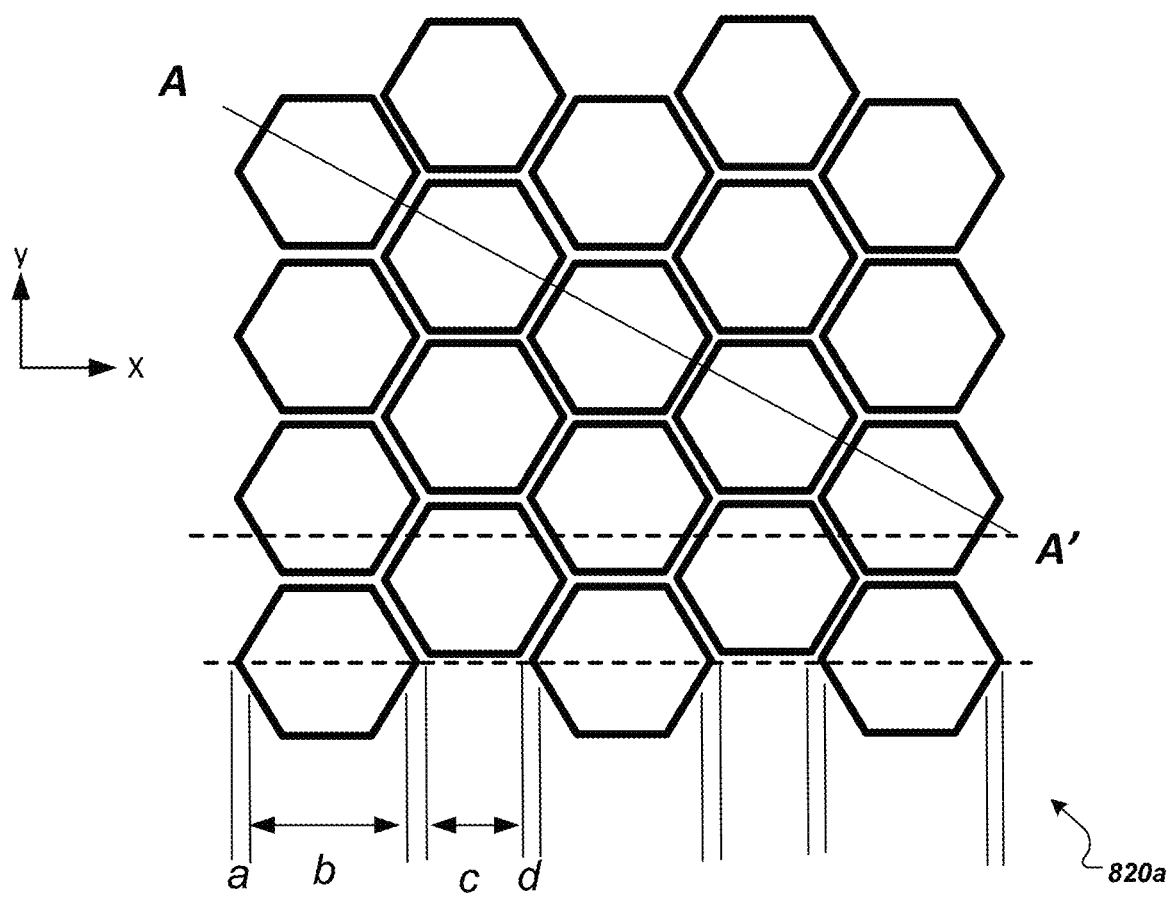
FIG. 8 illustrates a top view of an encapsulation layer that includes hexagonal polymer subunits.

FIG. 8 illustrates a possible configuration for hexagonal cells of an encapsulation sublayer. The cross-sectional direction A-A' approximately corresponds to the cross-sectional direction illustrated in FIGS. 7A-7B.

One advantage of an unaligned configuration (e.g., as shown in FIG. 7C) over an aligned configuration (e.g., as shown in FIG. 7B) is that the former can be easier and/or faster to manufacture than the latter because the machinery used to deposit the third and second encapsulation sublayers 720a and 720b need not account for aligning the layers to the first encapsulation sublayer 620.

Returning to FIGS. 2A and 2B, in some implementations the encapsulation is aligned relative to the pixels or subpixels of the front-plane. In particular, the side walls of the polymer islands 214a in one or more of the polymer layers can be positioned vertically over the gap between adjacent subpixels. Similarly, the vertically extending portions 216a of conformal layer 216 can also be positioned vertically over the gap between adjacent subpixels. For example, the side walls of the polymer islands 214a and the vertically extending portions 216a can be positioned over the plateau of the PDL 115 (see FIG. 2A), or over the gap between anodes 114a of adjacent OLED devices (see FIG. 2B). This configuration reduces the likelihood of unwanted reflections, thus increasing transmittance and reducing the likelihood of visual defects.

In some implementations, the dimensions of the encapsulation 102 can correlate with the pixel geometry of the front-plane 110. For example, the pitch of the cells of the encapsulation 102 can be an integer multiple of the pitch of the subpixels. Although FIGS. 2A and 2B illustrate systems in which the pitch of the cells 130 of the encapsulation 102 are equal to the pitch of the subpixels, this is not required.

Figure 9A:
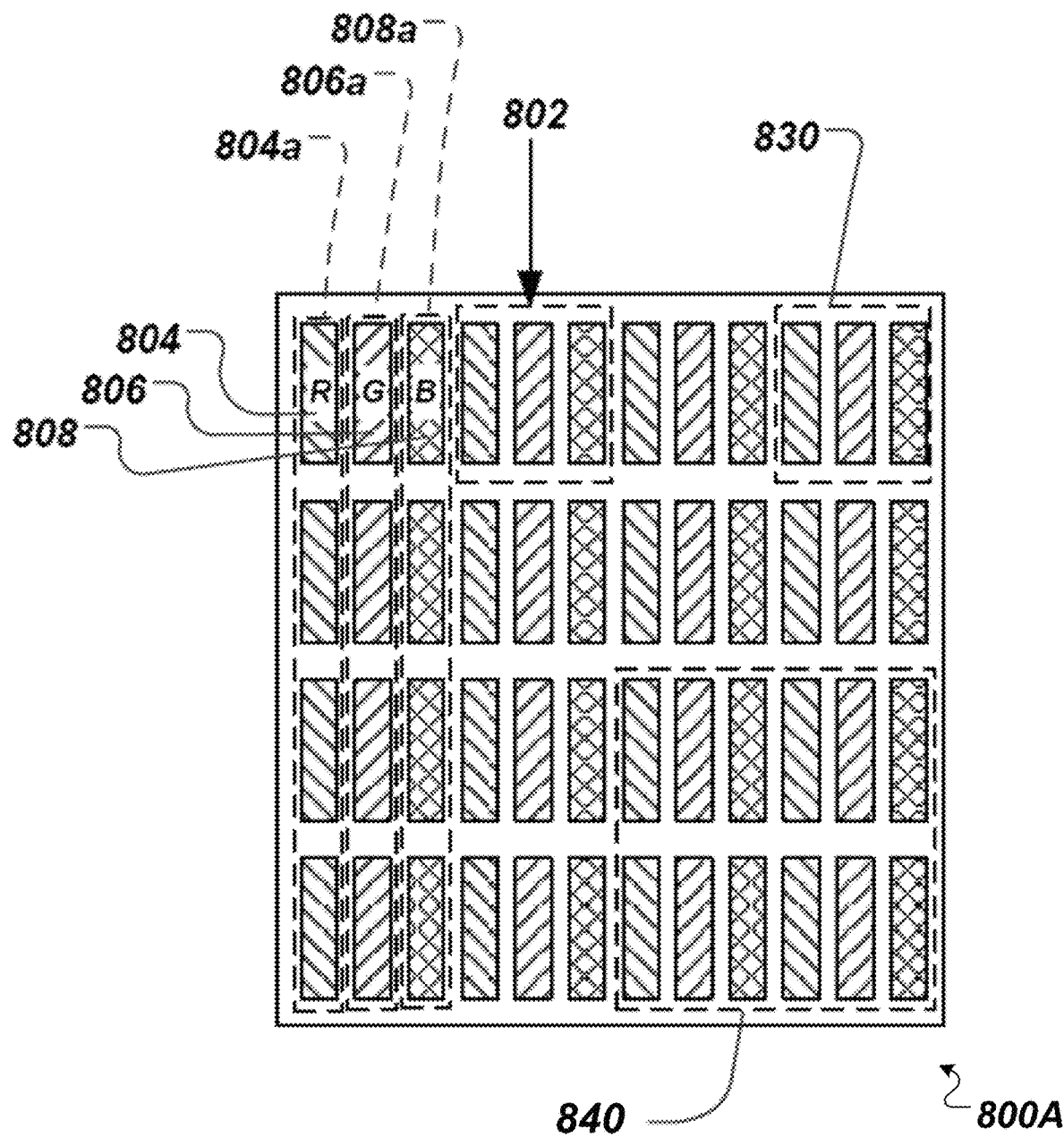
FIG. 9A illustrates an example stripe pixel geometry for an OLED device.

Example RGB pixel geometries of the front-plane 110 include triangular, diagonal, stripe, and PenTile. FIG. 9A illustrates a stripe pixel geometry 800A, while FIG. 9B illustrates a schematic cross-sectional view of a portion of the stripe pixel geometry.

Referring to FIG. 9A, the stripe pixel geometry 800A includes columns 804a of red subpixels 804, columns 806a of green subpixels 806, and columns 808a of blue subpixels 808. An example pixel 802 includes one sub-pixel of each color, e.g., sequential sub-pixels along a row. However, other configurations are possible, e.g., a pixel could include four of each color subpixel. FIG. 9B further illustrates a space 908 between adjacent subpixels.

The cells 830 of one or more encapsulation sublayers can span multiple subpixels. For example, each cell 830 can span a number of subpixels corresponding to an integer, n, multiple of the number of subpixels in a pixel, e.g., while the cell 830 includes one subpixel of each color, a larger cell can include an integer multiple of each subpixel. For example, FIG. 9A includes a cell 840 that includes four subpixels of each color, making the integer multiple n=4.

Figure 9B:
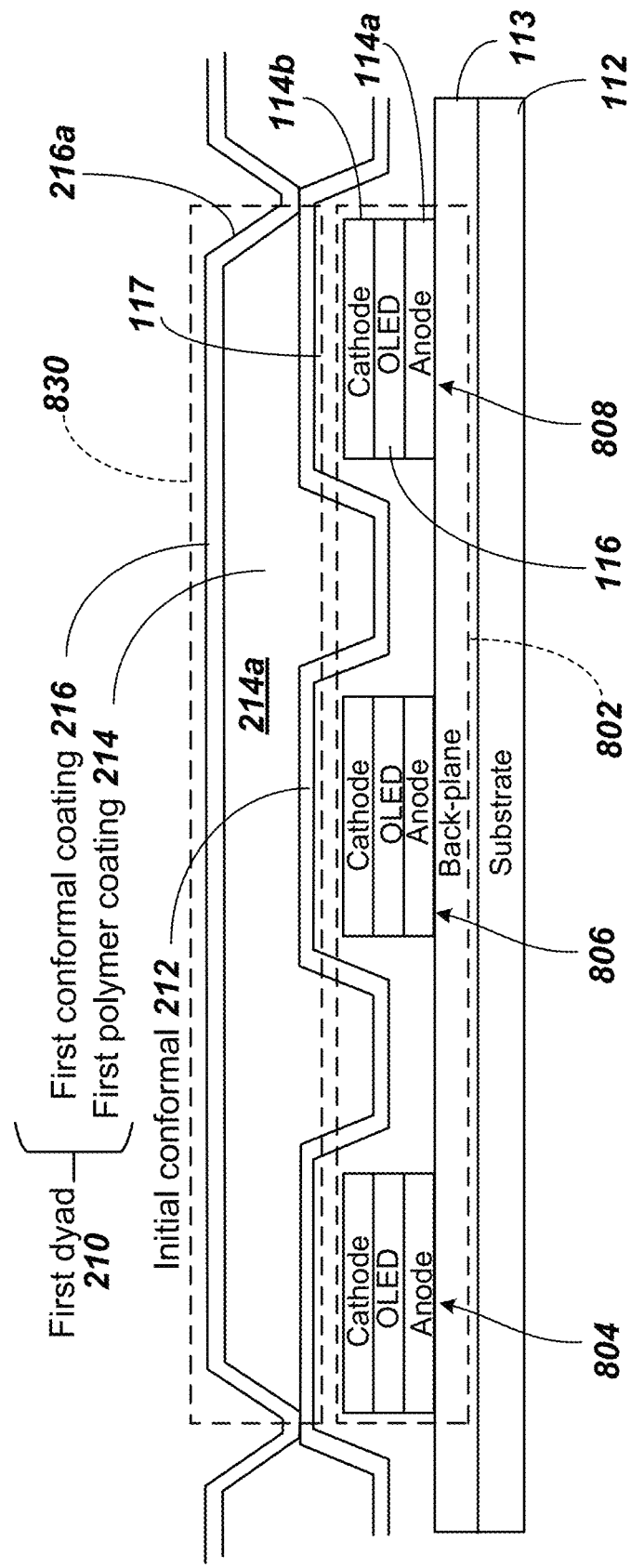
FIG. 9B is a schematic cross-sectional view of a portion of the stripe pixel geometry of FIG. 9A.

In some implementations, e.g., as shown in FIGS. 9A and 9B, the edges of the cells 830 in one or more encapsulation sublayers are aligned with the edges of the pixels. For example, the edges of the cells, i.e., the vertically extending portions 216a of the conformal layer 116, can be aligned with the spaces between adjacent subpixels (regardless of whether the cells are aligned with the pixels or span subpixels from different pixels). However, the cells 830 can be offset relative to the pixels.

When an OLED display, such as the OLED display 100A', includes the pixel geometry 800A, the dimensions of the polymer features of the encapsulation 102 can vary depending on the pixel density and pixel size. For example, for an encapsulation that includes pixels 802 for a display having a pixel density of 200 ppi, the diameter, Cd, of an encapsulation cell can be about 120 µm to about 135 µm (e.g., about 124 µm to about 130 µm). If instead an encapsulation includes cells that are an integer multiple of the cell 803 at a pixel density of 200 ppi, Cd, can be integer multiples of the aforementioned ranges, e.g., about 240 µm to about 270 µm. For pixel densities of 200 ppi, the encapsulation cells can have a height of a 1 µm to about 20 µm.

As another example, for an encapsulation that includes cells 840 that span multiple subpixels of the same color, for a display having a pixel density of 400 ppi, the diameter, Cd, of an encapsulation cell (e.g., the encapsulation cell 612) can be about 60 µm to about 70 µm (e.g., about 60 µm to about 65 µm). If instead an encapsulation includes cells that are an integer multiple of the cell 840 at a pixel density of 400 ppi, Cd, can be integer multiples of the aforementioned ranges. For example, while cell 840 has four times as many subpixels of a certain color compared to the number of subpixels of the same color of cell 830, Cd for an encapsulation that includes cells 840 can be double the Cd for an encapsulation that includes cells 830. For pixel densities of 400 ppi, each example pixel 802 can include encapsulation cells having a height, Ch, of about 1 µm to about 10 µm.

The spacing, as measured in the x or y-directions, between adjacent pixels can vary depending on the aperture ratio of the OLED device. For example, for aperture ratios of 70% the distance between adjacent pixels can be about 8

µm to about 14 µm, while for aperture ratios of 90% the distance between adjacent pixels can be about 2 µm to about 5 µm.

Figure 10:
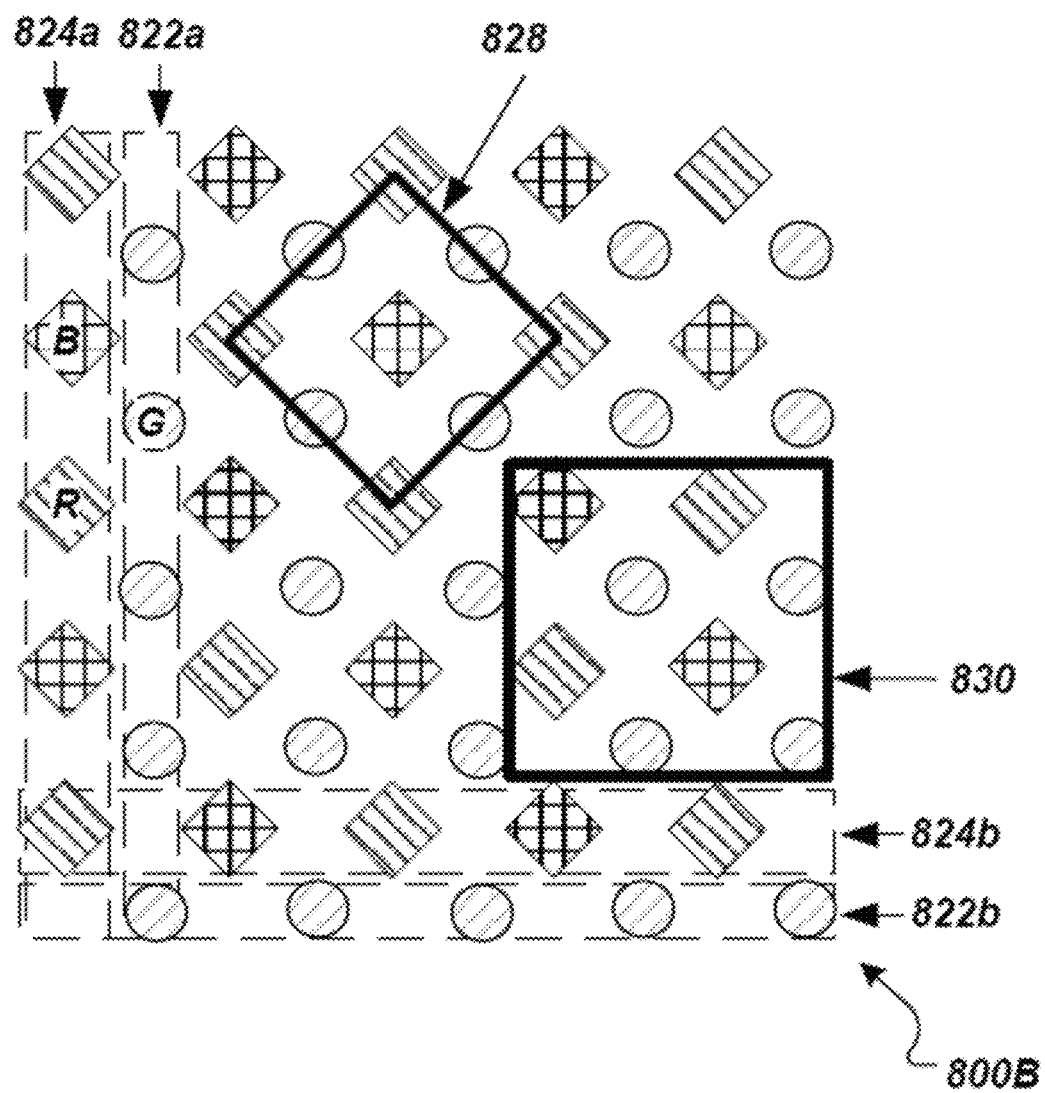
FIG. 10 illustrates an example PenTile pixel geometry for an OLED device.

Referring now to FIG. 10, the PenTile pixel geometry 800B includes columns of green subpixels 822a and rows of green subpixels 822b. The PenTile pixel geometry 800B also includes columns of alternating red and blue subpixels 824a and rows of alternating red and blue subpixels 824b. The PenTile pixel geometry further includes two example pixel sizes 828 and 830, each of which is outlined by a solid line.

In some implementations, the side walls of the polymer islands 214a and the vertically extending portions 216a of conformal layer 216 are positioned in about the same location for each pixel, e.g., vertically over about the center of the pixel. In some implementations, d1 and d2 are chosen such that the vertically extending portions of conformal layers approximately align with the spaces between pixels. In some implementations, Cd is chosen such that the side walls of an encapsulation cell approximately align with the spaces between pixels.

Pixel 828 includes four halves of four different green subpixels, four quarters of four different red subpixels, and one blue subpixel. In some implementations, instead of including four red quarters and a blue subpixel in the middle of the pixel, a pixel of the same size as pixel 828 can include four green halves, four blue quarters, and a red subpixel in the middle of the pixel. Pixel 830 includes four green subpixels, two red subpixels and two blue subpixels. The pixel density of the PenTile pixel geometry 800B can be approximately 575 ppi. The dimensions of the dielectric component of an encapsulation used to encapsulate an OLED display that includes the PenTile pixel geometry 800B, e.g., the encapsulation 102, can vary depending on the pixel size.

For example, while the encapsulation cell is not illustrated in FIG. 10 for an encapsulation that includes pixels 828, the diameter, Cd, of an encapsulation cell can be about 75 µm to about 85 µm, while for the pixel size 830, the diameter, Cd, of the encapsulation cell can be about 105 µm to about 125 µm. For both pixels 828 and 830, and can include encapsulation cells can have a height, Ch, of a 1 µm to about 20 µm.

In some implementations, an expanded pixel spans more subpixels than are spanned by the pixels 1002 or 1004. In such implementations, the edges of a cell can be aligned with the edges of the subpixels spanned by the expanded pixel.

Although the description above focuses on organic light-emitting diodes, the techniques can be applicable to light-emitting diodes formed from inorganic materials, or to electronic displays that include other types of light-emitting components, such as quantum dots, or light-blocking components, such as liquid crystal displays. In addition, the encapsulation can be applicable to other flex/stretchable electronics that need protection from ambient oxidants.

Rather than having a hemispherical upper portion, the polymer dots can have other shapes, such as a trapezoidal cross-section. The conformal coating would then form sloped side walls along the inclined outer surface of the trapezoidal polymer dots.

In addition to disclosing TFEs that are stretchable and flexible, the TFEs of this disclosure can be further equipped with additional functions by appropriately selecting the materials and architectures of the TFEs. For example, the one or more materials that make up the polymer layers can be chosen so that the layers have an index of refraction that is close to or greater than the index of refraction of the organic materials of the OLED stack, which can be approximately 1.8 or larger. In such a case, the total internal reflection angle for the emitted light as it exits the OLED stack and enters the TFE layers would be increased, thereby enhancing the light outcoupling into the TFE. The light outcoupling into the TFE can be enhanced by allowing light generated by the OLEDs to be emitted in more divergent angles such that they are not reflected but outcoupled. Example polymer materials include colloidal dispersions of high index nanoparticles of high index oxides, like TiO2 and ZrO2. Such materials can raise the effective index of refraction of polymer materials.

The disclosed dielectric layers can also reduce the divergence of light emitted from OLEDs, which is typically near Lambertian dispersion. By placing multiple NIL or MIL produced features of dielectrics within a pixel area, and by tailoring the curvature of the top surface of the polymer in the pixel area, as illustrated in FIGS. 6B and 6C, refocusing of the light emitted at higher angles can be achieved. Such lower divergent input light source can be used to enable controlled deflection of the light to create the so-called light-field based 3D display, where a "pixel" in a light-field 3D display comprises multiple regular pixels, each of which renders a given image in multiple directions to create 3D imagery.

What is claimed is:

1. A display device, comprising:
    a display layer having a plurality of light-emitting diodes with each light-emitting diode comprising a light generating layer, the display layer having a capping layer that extends above all light emitting materials in the display device and over spaces between the plurality of light emitting diodes to provide substantially planar top surface that spans the plurality of light-emitting diodes and the spaces between the plurality of light emitting diodes; and
    an encapsulation layer covering a light-emitting side of the display layer above the substantially planar top surface, the encapsulation layer including
        a plurality of polymer projections on the display layer, wherein the plurality of polymer projections have spaces therebetween that expose the substantially planar top surface of the display layer, and wherein each polymer projection has an upper surface that is substantially parallel to the substantially planar top surface and sides extending from the substantially planar top surface to the upper surface, and
        a first dielectric layer conformally covering the plurality of polymer projections and the substantially planar top surface of the display layer in the spaces between the polymer projections, wherein the first dielectric layer forms side walls along the sides of the polymer projections and defining wells extending into spaces between the side walls so that the wells extend below upper surfaces of the polymer projections.

2. The device of claim 1, wherein the first dielectric layer is an inorganic oxide or mixture of inorganic oxides.

3. The device of claim 1, wherein the plurality of polymer projections comprise a photoresist.

4. The device of claim 1, wherein the plurality of first polymer projections are provided by a plurality of discrete projections.

5. The device of claim 4, wherein the plurality of first polymer projections comprise a plurality of annular projections having one or more side walls, and wherein the spaces between the polymer projections comprise an aperture surrounded by the one or more side walls of the annular projections.

6. The device of claim 1, wherein the plurality of first polymer projections are provided by an interconnected structure having a plurality of apertures therethrough, and wherein the spaces between the polymer projections are provided by the plurality of apertures.

7. The device of claim 1, wherein at least a portion of sides of the polymer projections is at an oblique angle relative to an underlying surface.

8. The device of claim 1, wherein sides of the polymer projections are substantially perpendicular to the substantially planar top surface of the display layer.

9. The device of claim 1, further comprising a filler material that completely fills the wells.

10. The device of claim 9, wherein the filler material extends from the wells and covers portions of the first dielectric layer on top of the upper surfaces of the polymer projections.

11. The device of claim 10, further comprising:
a plurality of second polymer projections on the filler material, wherein the plurality of second polymer projections have spaces therebetween that expose the filler material, and wherein each second polymer projection has a second upper surface that is substantially parallel to the substantially planar top surface and sides extending from the filler material to the second upper surface, and
a second dielectric layer conformally covering the plurality of second polymer projections and the filler material in the spaces between the second polymer projections, wherein the second dielectric layer forms second side walls along the sides of the second polymer projections and defining second wells extending into spaces between the second side walls so that the second wells extend below second upper surfaces of the second polymer projections.

12. The device of claim 11, wherein the filler material is a polymer.

13. A display device, comprising:
a display layer having a plurality of light-emitting diodes, the display layer having a capping layer that extends over the plurality of light-emitting diodes and spaces between the plurality of light emitting diodes to provide substantially planar top surface that spans the plurality of light-emitting diodes and the spaces between the plurality of light emitting diodes; and
an encapsulation layer covering a light-emitting side of the display layer above the substantially planar top surface, the encapsulation layer including
a plurality of first polymer projections on the display layer, wherein the plurality of first polymer projections are optically transmissive and have spaces therebetween that expose the substantially planar top surface of the display layer, and wherein each first polymer projection has a first upper surface that is substantially parallel to the substantially planar top surface and sides extending from the substantially planar top surface to the first upper surface, and
a first dielectric layer conformally covering the plurality of first polymer projections and the substantially planar top surface of the display layer in the spaces between the first polymer projections, wherein the first dielectric layer forms first side walls along the sides of the first polymer projections and defining first wells extending into spaces between the first side walls so that the first wells extend below first upper surfaces of the first polymer projections,
a first filler that fills the first wells and covers portions of the first dielectric layer over first upper surfaces of the first polymer projections,
a plurality of second polymer projections on the first filler, wherein the plurality of second polymer projections are optically transmissive and have spaces therebetween that expose the first filler, and wherein each second polymer projection has a second upper surface that is substantially parallel to the substantially planar top surface and sides extending from the first filler to the second upper surface, and
a second dielectric layer conformally covering the plurality of second polymer projections and the first filler in the spaces between the second polymer projections, wherein the second dielectric layer forms second side walls along the sides of the second polymer projections and defining second wells extending into spaces between the second side walls so that the second wells extend below second upper surfaces of the second polymer projections.

14. The device of claim 13, wherein the first filler is a polymer filler.

15. The device of claim 13, wherein the first polymer projections and second polymer projections each comprise a photoresist.

16. The device of claim 13, further comprising:
a second filler that fills the second wells and covers portions of the second dielectric layer over second upper surfaces of the second polymer projections,
a plurality of third polymer projections on the second filler, wherein the plurality of second polymer projections have spaces therebetween that expose the second filler, and wherein each third polymer projection has a third upper surface that is substantially parallel to the substantially planar top surface and sides extending from the second filler to the third upper surface, and
a third dielectric layer conformally covering the plurality of third polymer projections and second filler in the spaces between the third polymer projections, wherein the third dielectric layer forms third side walls along the sides of the third polymer projections and defining third wells extending into spaces between the third side walls so that the third wells extend below third upper surfaces of the third polymer projections.

17. The device of claim 13, wherein the plurality of first polymer projections are vertically aligned with the plurality of second polymer projections.

18. The device of claim 13, wherein the plurality of first polymer projections are laterally offset from the plurality of second polymer projections.

* * * * *

UNITED STATES PATENT AND TRADEMARK OFFICE
CERTIFICATE OF CORRECTION

PATENT NO. : 11,925,073 B2
APPLICATION NO. : 17/494600
DATED : March 5, 2024
INVENTOR(S) : Kyuil Cho, Byung Sung Kwak and Robert Jan Visser It is certified that error appears in the above-identified patent and that said Letters Patent is hereby corrected as shown below:

In the Claims

In Column 20, Line 62, Claim 4, after "plurality of" delete "first".

In Column 20, Line 65, Claim 5, after "plurality of" delete "first".

In Column 21, Line 4, Claim 6, after "plurality of" delete "first".

Signed and Sealed this
Twenty-third Day of April, 2024

Katherine Kelly Vidal
*Director of the United States Patent and Trademark Office*